US012635354B2

(12) United States Patent
Jung

(10) Patent No.: US 12,635,354 B2
(45) Date of Patent: May 19, 2026

(54) DISPLAY DEVICE

(71) Applicant: SAMSUNG DISPLAY CO., LTD.,
Yongin-si (KR)

(72) Inventor: Inyoung Jung, Yongin-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 443 days.

(21) Appl. No.: 18/461,728

(22) Filed: Sep. 6, 2023

(65) Prior Publication Data

US 2024/0206239 A1     Jun. 20, 2024

(30) Foreign Application Priority Data

Dec. 19, 2022     (KR) ........................ 10-2022-0177828

(51) Int. Cl.
*H10K 59/122*          (2023.01)
*G06F 3/041*           (2006.01)
                          (Continued)
(52) U.S. Cl.
CPC ......... *H10K 59/122* (2023.02); *G06F 3/0412*
(2013.01); *G06F 3/0445* (2019.05);
(Continued)
(58) Field of Classification Search
CPC .. G09G 3/3233; G09G 3/3648; G09G 3/3677;
G09G 3/20; G09G 3/3266; G09G 3/3225;
G09G 3/3688; G09G 3/3275; G09G
3/3258; G09G 3/32; G09G 3/3208; G09G 2300/0426; G09G 2300/0842; G09G
2300/0861; G09G 2300/0819; G09G
2300/0809; G09G 2300/0852;
(Continued)

(56) References Cited

U.S. PATENT DOCUMENTS

| | | | |
|---|---|---|---|
| 10,739,931 B2 | 8/2020 | Kim et al. | |
| 2021/0132720 A1* | 5/2021 | Lee ........................ | G06F 3/0446 |

(Continued)

FOREIGN PATENT DOCUMENTS

| | | |
|---|---|---|
| CN | 110890406 | 3/2020 |
| CN | 114823832 | 7/2022 |
| KR | 10-2022-0096761 | 7/2022 |

*Primary Examiner* — Dong Hui Liang
(74) *Attorney, Agent, or Firm* — F. CHAU &
ASSOCIATES, LLC

(57)          ABSTRACT
A display device includes a display panel including a base
layer including light-emitting areas and a non-light-emitting
area adjacent to the light-emitting areas, a pixel defining
layer disposed on the base layer and having openings
defined, a partitioning wall disposed on the pixel defining
layer, light-emitting elements, each including an anode
disposed in a corresponding one of the openings, a cathode
contacting the partitioning wall, and a light-emitting pattern
disposed between the anode and the cathode, and an encap-
sulation layer covering the light-emitting elements, and an
input sensor disposed on the display panel, the input sensor
including conductive lines overlapping the partitioning wall.
The partitioning wall may have line patterns defined therein
by removing at least a portion of the partitioning wall, with
the line patterns overlapping the non-light-emitting area, and
at least some of the conductive lines may overlap the line
patterns.

20 Claims, 12 Drawing Sheets

(51) Int. Cl.
      *G06F 3/044*       (2006.01)
      *H10K 59/40*       (2023.01)

(52) U.S. Cl.
      CPC ......... *H10K 59/40* (2023.02); *G06F 3/04164*
          (2019.05); *G06F 3/0446* (2019.05); *G06F*
          *2203/04111* (2013.01)

(58) Field of Classification Search
      CPC ... G09G 2300/0452; G09G 2310/0286; G09G
          2310/08; G09G 2310/027; G09G
          2310/0297; G09G 2320/0233; G09G
          2320/043; G06F 3/0412; G06F 3/0446;
          G06F 3/044; G06F 3/04164; G06F
          3/0445; G06F 3/0448; G06F 3/04166;
          G06F 3/0416; G06F 3/041; G06F 3/0418;
          G09F 2230/04103; G09F 2230/04112;
          G09F 2230/04111; G09F 2230/04107;
          G09F 2230/04102
      See application file for complete search history.

(56)             References Cited

U.S. PATENT DOCUMENTS

| | | | |
|---|---|---|---|
| 2022/0019305 A1* | 1/2022 | Ye | H10K 59/353 |
| 2022/0206621 A1 | 6/2022 | Lee et al. | |
| 2023/0017957 A1* | 1/2023 | Koide | G09F 9/30 |
| 2023/0038990 A1* | 2/2023 | Kim | H10K 59/353 |

* cited by examiner

FIG. 8

DISPLAY DEVICE

CROSS-REFERENCE TO RELATED APPLICATIONS

This application claims priority under 35 U.S.C. § 119 to Korean Patent Application No. 10-2022-0177828, filed on Dec. 19, 2022, in the Korean Intellectual Property Office, the disclosures of which are incorporated by reference herein in their entireties.

TECHNICAL FIELD

The present disclosure relates to a display device, and more particularly, relates to a display device in which an input sensor has enhanced performance.

DISCUSSION OF RELATED ART

Various electronic devices, that are used in multi-media devices such as, for example, a television, a mobile phone, a tablet computer, a navigation system, and a game console, include a display device. The display device may include a display panel that displays an image. The display panel includes an organic light-emitting display panel which has wide viewing angles, low power consumption, high luminance, high contrast ratios, high response speed, and excellent driving voltage.

The organic light-emitting display panel includes an anode, a cathode, and a light-emitting pattern. Each of light-emitting patterns is defined in each of light-emitting areas, and the cathode provides a common voltage to the light-emitting areas. An input sensor may be formed on the organic light-emitting display panel, and due to close proximity between some conductive layers, parasitic capacitance between, for example, the cathode and conductive lines included in the input sensor may occur.

SUMMARY

Embodiments of the present disclosure provide a display device in which parasitic capacitance of conductive lines included in an input sensor is reduced.

According to an embodiment of the present disclosure, a display device includes a display panel including a base layer including light-emitting areas and a non-light-emitting area adjacent to the light-emitting areas, a pixel defining layer disposed on the base layer and having openings defined therein corresponding to the light-emitting areas, a partitioning wall disposed on the pixel defining layer, light-emitting elements, each including an anode disposed in a corresponding one of the openings defined in the pixel defining layer, a cathode disposed on the anode and contacting the partitioning wall, and a light-emitting pattern disposed between the anode and the cathode, and an encapsulation layer covering the light-emitting elements, and an input sensor disposed on the display panel, the input sensor including conductive lines, with the conductive lines overlapping the partitioning wall. The partitioning wall may have line patterns defined therein by removing at least a portion of the partitioning wall, with the line patterns overlapping the non-light-emitting area. and at least some of the conductive lines may overlap the line patterns.

In an embodiment of the present disclosure, the partitioning wall may include a lower layer including a conductive material and disposed on the pixel defining layer, and an upper layer disposed on the lower layer and including a conductive material.

In an embodiment of the present disclosure, the lower layer may include aluminum, and the upper layer may include titanium.

In an embodiment of the present disclosure, each of the line patterns may be formed by removing the upper layer and the lower layers to expose an upper surface of the pixel defining layer.

In an embodiment of the present disclosure, each of the line patterns may be formed by removing the upper layer to expose an upper surface of the lower layer.

In an embodiment of the present disclosure, each of the line patterns may be formed by removing the upper layer and a portion of the lower layer.

In an embodiment of the present disclosure, the partitioning wall may include first patterns, each surrounding each of the light-emitting elements corresponding thereto in a plan view of the display device, and second patterns, at least one of the second patterns being disposed between adjacent ones of the first patterns, in which the line patterns non-overlap with the second patterns.

In an embodiment of the present disclosure, some of conductive lines may overlap the second patterns.

In an embodiment of the present disclosure, two of the second patterns adjacent to each other and spaced apart from each other may be disposed between the adjacent ones of the first patterns.

In an embodiment of the present disclosure, the encapsulation layer may include a first inorganic layer, an organic layer, and a second inorganic layer sequentially stacked, in which the first inorganic layer may cover the line patterns.

In an embodiment of the present disclosure, the organic layer may be disposed on the first inorganic layer covering the line patterns.

In an embodiment of the present disclosure, the display device may further include capping patterns respectively disposed on the cathodes corresponding thereto, the capping patterns being covered with the first inorganic layer.

In an embodiment of the present disclosure, the display device may further include a dummy pattern disposed on the partitioning wall, in which the dummy pattern may have dummy holes defined therein, with the dummy holes respectively overlapping the line patterns, and the dummy pattern includes: a first pattern disposed on the upper layer and including a material the same as a material of the light-emitting patterns, a second pattern disposed on the first pattern and including a material the same as a material of the cathodes, and a third pattern disposed on the second pattern, and covered with the first inorganic layer, in which the third pattern may include a material the same as a material of the capping patterns.

In an embodiment of the present disclosure, each of the lower layer, the upper layer, the first pattern, the second pattern, and the third pattern may include an opening defined therein overlapping corresponding one of the light-emitting areas, in which a width of the opening defined in the lower layer may be greater than each of a width of the opening defined in the upper layer, a width of the opening defined in the first pattern, a width of the opening defined in the second pattern, and a width of the opening defined in the third pattern.

In an embodiment of the present disclosure, the input sensor may include a first sensing insulating layer directly disposed on the encapsulation layer, a first conductive layer disposed on the first sensing insulating layer, a second sensing insulating layer covering the first conductive layer and disposed on the first sensing insulating layer, a second conductive layer disposed on the second sensing insulating layer, and a third sensing insulating layer covering the second conductive layer and disposed on the second sensing insulating layer, in which the conductive lines may be included in the second conductive layer.

In an embodiment of the present disclosure, the display device may further include sacrificial patterns, in which each of the sacrificial patterns may be disposed on an edge of a corresponding one of the anodes, and may be covered with a corresponding one of the light-emitting patterns and the pixel defining layer.

In an embodiment of the present disclosure, each of the line patterns may be disposed between four of the cathodes and may have an 'X' shape in a plan view of the display device.

In an embodiment of the present disclosure, the cathodes may be electrically connected to each other via the partitioning wall.

In an embodiment of the present disclosure, each of the conductive lines may include a transparent conductive material.

In an embodiment of the present disclosure, the display panel may include at least one transistor disposed on the base layer and connected to a corresponding one of the anodes.

BRIEF DESCRIPTION OF THE DRAWINGS

The above and other aspects and features of the present disclosure will become apparent by describing in detail embodiments thereof with reference to the accompanying drawings, in which:

FIG. 8 is a cross-sectional view of a display panel according to an embodiment of the present disclosure;

Figure 1A:
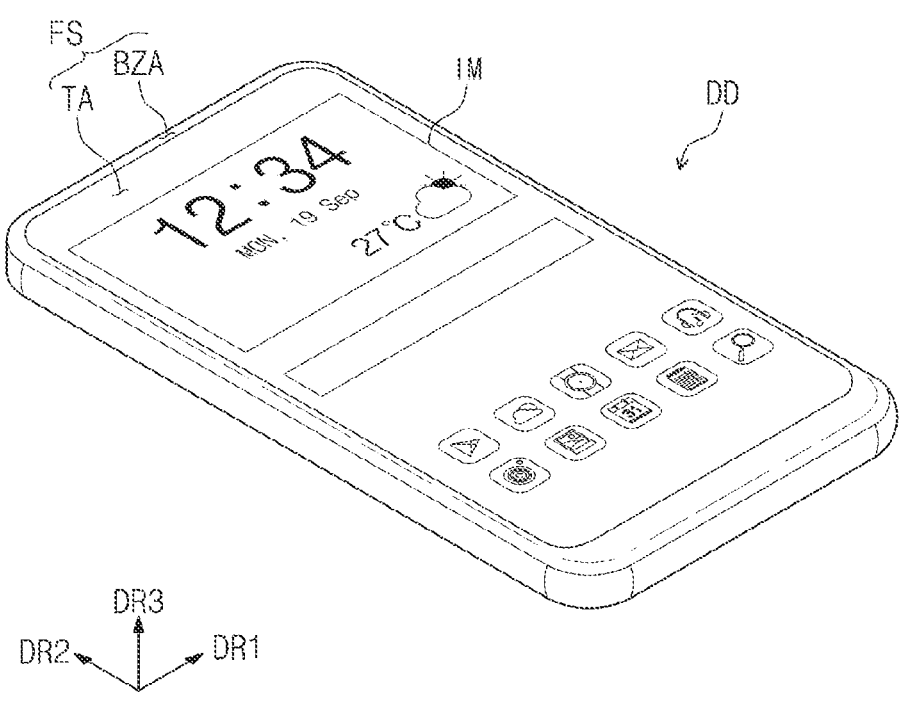
FIG. 1A is a perspective view of a display device according to an embodiment of the present disclosure.

Since the drawings in FIGS. 1-10 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

As used herein, when a component (or a region, a layer, a portion, etc.) is referred to as being "on", "connected to", or "coupled to" another component, it means that the component may be directly disposed/connected/coupled on or to another component or a third component may be disposed between the component and another component.

Like reference numerals refer to like components. "and/or" includes any and all combinations that the associated components may define.

Terms such as "first", "second", etc. may be used to describe various components, but the components should not be limited by the terms. The above terms are used only for the purpose of distinguishing one component from another. For example, without departing from the spirit and scope of the present disclosure, a first component may be named as a second component, and similarly, the second component may also be named as the first component. The singular expression is intended to include the plural expression unless the context clearly indicates otherwise.

In addition, terms such as "beneath", "below", "on", "above" are used to describe the relationship of the components illustrated in the drawings. The above terms are relative concepts, and are described with reference to directions indicated in the drawings. These relative terms are intended to encompass different orientations of the device in use or operation, in addition to the orientation depicted in the drawings.

It should be understood that terms such as "include" or "have" are intended to specify that a feature, a number, a step, an operation, a component, a part, or a combination thereof described in the specification is present, and do not preclude the addition or existence of one or more other features, numbers, steps, operations, components, parts, or combinations thereof.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to drawings.

Figure 1B:
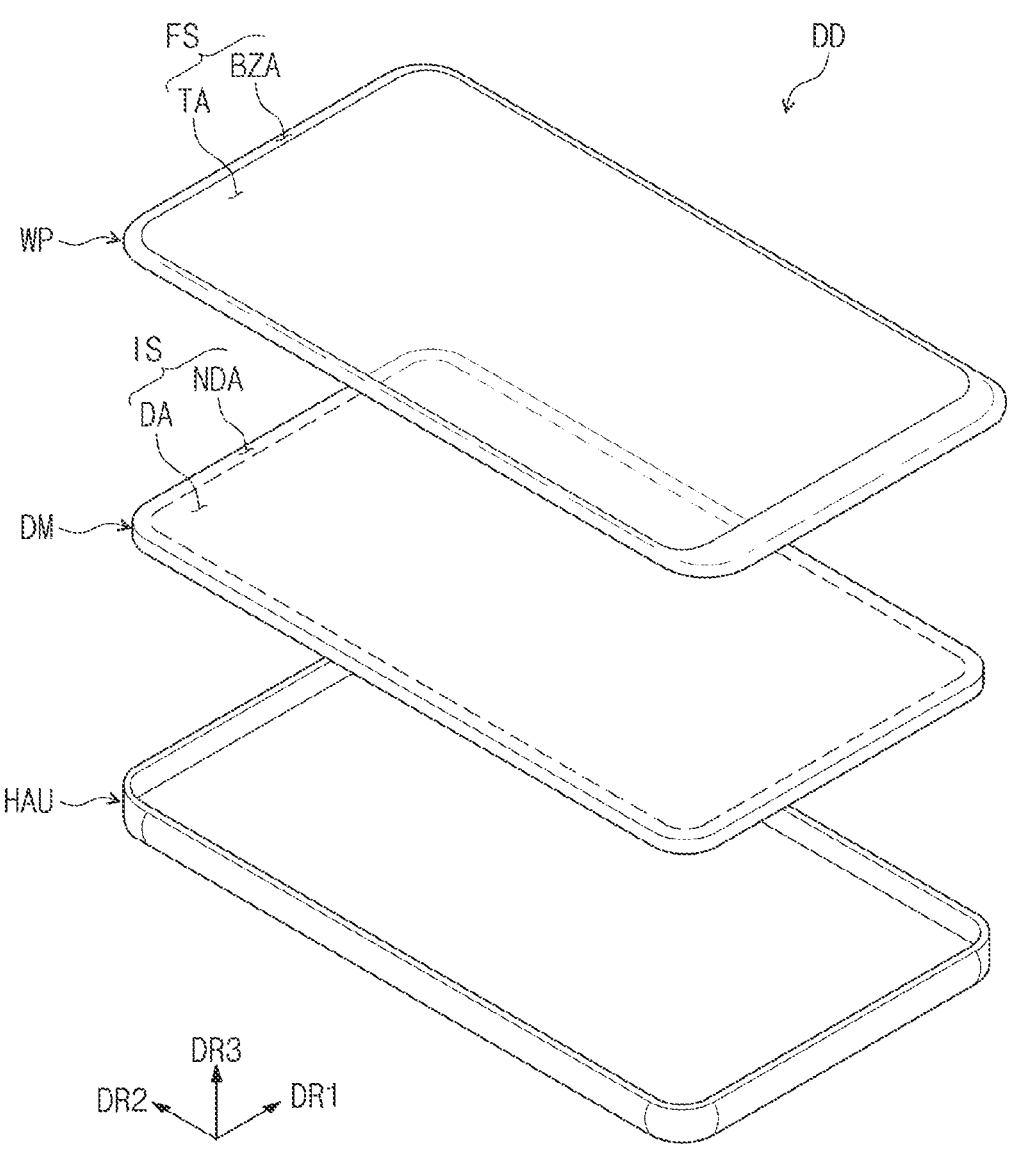
FIG. 1B is an exploded perspective view of a display device according to an embodiment of the present disclosure.
Figure 2:
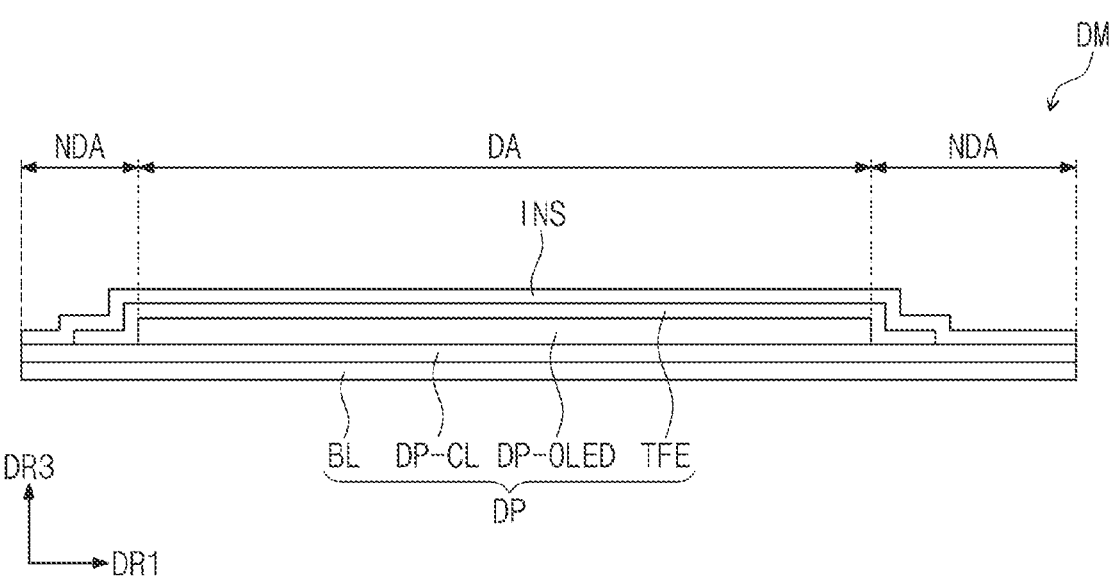
FIG. 2 is a cross-sectional view of a display panel according to an embodiment of the present disclosure.

FIG. 1A is a perspective view of a display device according to an embodiment of the present disclosure. FIG. 1B is an exploded perspective view of a display device according to an embodiment of the present disclosure. FIG. 2 is a cross-sectional view of a display panel according to an embodiment of the present disclosure.

In an embodiment of the present disclosure, a display device DD may be a large electronic device such as, for example, a television, a monitor, or an external billboard. Further, the display device DD may be a small or medium-sized electronic device such as, for example, a personal computer, a notebook computer, a personal digital assistance, a car navigation unit, a game console, a smartphone, a tablet, a smart watch, and a camera. These are merely presented by way of example. Other display devices may be employed as long as they do not deviate from the concept of the present disclosure. In this embodiment, an example in which the display device DD is the smart phone is shown by way of example.

Referring to FIG. 1A, FIG. 1B, and FIG. 2, the display device DD may display an image IM on a display surface FS parallel to each of a first direction DR1 and a second direction DR2. The normal direction of the display surface FS, that is, a thickness direction of the display device DD indicates a third direction DR3. For example, the display device DD may display the image IM towards the third direction DR3. The image IM may include a still image as well as a moving image. In FIG. 1A, a clock window and icons are shown by way of example of the image IM. The display surface FS on which the image IM is displayed may correspond to a front surface of the display device DD. The display surface FS may be a flat surface. However, the present disclosure is not limited thereto. For example, the display surface FS may be a curved surface or a three-dimensional surface. The three-dimensional display surface, in which images are generated within a display volume rather than upon a stationary surface, may include a plurality of display areas, for example, a polyprism surface. The plurality of display areas may be oriented in different directions.

In this embodiment, a front surface (or an upper surface) and a rear surface (or a lower surface) of each of members are defined based on a direction in which the image IM is displayed. The front surface and the rear surface are opposite to each other in the third direction DR3, and a normal direction to each of the front surface and the rear surface may be parallel to the third direction DR3. In one example, directions respectively indicated by the first to third directions DR1, DR2, and DR3 may be of a relative concept and may be exchanged with each other. As used herein, "a plan view" may mean a view in the third direction DR3.

As shown in FIG. 1B, the display device DD according to an embodiment of the present disclosure may include a window WP, a display module DM, and a housing HAU. The window WP and the housing HAU are combined to each other to form an appearance of the display device DD.

The window WP may include an optically transparent insulating material capable of outputting the image IM. For example, the window WP may be made of, for example, glass, plastic or a combination thereof. A front surface of the window WP may define the display surface FS of the display device DD. The display surface FS may include a transmissive area TA and a bezel area BZA. The transmissive area TA may be an optically transparent area. For example, the transmissive area TA may be an area having visible light transmittance of about 90% or higher.

The bezel area BZA may be an area having relatively lower light transmittance compared to that of the transmissive area TA, and may include an opaque material that blocks a light. The bezel area BZA may have a certain color. According to an embodiment of the present disclosure, the bezel area BZA may be defined by a printed layer formed on a transparent substrate. For example, when the window WP is provided as a glass or plastic substrate, the bezel area BZA may be a color layer printed or deposited on one side of a glass or plastic substrate. For example, the bezel area BZA may be formed by coloring the corresponding area of the glass or plastic substrate. The bezel area BZA may define a shape of the transmissive area TA. The bezel area BZA may be adjacent to the transmissive area TA and may surround the transmissive area TA. For example, the bezel area BZA may be located outside the transmission area TA. However, the present disclosure is not limited thereto, and the bezel area BZA may be disposed adjacent to only one side of the transmission area TA. Also, this is shown by way of example. In the window WP according to an embodiment of the present disclosure, the bezel area BZA may be omitted. The window WP may include at least one functional layer of an anti-fingerprint layer, a hard coating layer, and an anti-reflective layer. The anti-reflective layer decreases reflectivity of an external light incident from above the window WP.

The anti-reflective layer according to an embodiment of the present disclosure may include a retarder and a polarizer. However, the present disclosure is not limited to any one embodiment.

The display module DM may be disposed under the window WP. The display module DM may be a component that actually generates the image IM. The display module DM may display the image IM depending on an electrical signal and may transmit/receive information about an external input. The image IM generated by the display module DM may be displayed on a display surface IS of the display module DM and may be recognized by a user from an outside through the transmissive area TA.

The image IM may be displayed on the display surface IS of the display module DM. The display surface IS of the display module DM may include a display area DA and a non-display area NDA. The display area DA may be an area activated according to an electrical signal. For example, the transmission area TA overlaps the entire surface or at least part of the display area DA. The image IM displayed on the display area DA of the display device DD may be viewed from the outside through the transmission area TA. The non-display area NDA may be adjacent to the display area DA. The non-display area NDA may surround the display area DA. The non-display area NDA is an area covered with the bezel area BZA and cannot be visible to the user from the outside. For example, the non-display area NDA may be an area where the image IM is not displayed.

As shown in FIG. 2, the display module DM according to an embodiment of the present disclosure may include a display panel DP and an input sensor INS. The display device DD according to an embodiment of the present disclosure may further include a protective member disposed on a lower surface of the display panel DP or an anti-reflective member and/or a window member disposed on an upper surface of the input sensor INS.

The display panel DP may be a light-emitting type display panel, and is not particularly limited. For example, the display panel DP may be an organic light-emitting display panel or an inorganic light-emitting display panel. The panels are distinguished depending on constituent materials of light-emitting elements. A light-emitting layer in the organic light-emitting display panel includes an organic light-emitting material. A light-emitting layer in the inorganic light-emitting display panel includes quantum dots, quantum rods, or micro LEDs. A light-emitting layer of the quantum dot light-emitting display panel may include quantum dots, quantum rods, and/or the like. Alternatively, the display panel DP may be, for example, an inorganic light-emitting display panel, which may include an inorganic light-emitting material. The inorganic light-emitting material may include crystalline semiconductors such as, for example, gallium nitride (GaN), indium phosphide (InP), etc. Hereinafter, an example in which the display panel DP is embodied as the organic light-emitting display panel is described.

The display panel DP may include a base layer BL, and a circuit element layer DP-CL, a display element layer DP-OLED, and an encapsulation layer TFE disposed on the base layer BL. The input sensor INS may be directly disposed on the encapsulation layer TFE. As used herein, "a component A is directly disposed on a component B" means that an adhesive layer is not disposed between the components A and B. In an embodiment of the present disclosure, the display panel DP may further include an optical functional layer such as an anti-reflective layer and/or a refractive index control layer. The optical functional layer may reduce reflectance of a light (external light) incident from the outside towards the display device DD, and enhance color purity of a light emitted from the display device DD.

The base layer BL may include at least one plastic film. The base layer BL may be a flexible substrate and may include a plastic substrate, a glass substrate, a metal substrate, or an organic/inorganic composite substrate. In an embodiment of the present disclosure, the base layer BL may be a flexible substrate. For example, when the base layer BL is a flexible substrate, the base layer may include a polymer resin, and may be foldable, rollable, and/or bendable. In the present disclosure, the display area DA and the non-display area NDA are defined in the base layer BL. In this regard, components disposed on the base layer BL overlap with the display area DA or the non-display area NDA.

The display panel DP may include a plurality of insulating layers, a semiconductor pattern, a conductive pattern, a signal line, etc. The insulating layers, a semiconductor layer, and a conductive layer are formed using a scheme such as coating, deposition, etc. Thereafter, the insulating layers, the semiconductor layer, and the conductive layer may be selectively patterned using photolithography and etching. In this manner, the semiconductor pattern, the conductive pattern, the signal line, etc. included in the circuit element layer DP-CL and the display element layer DP-OLED are formed.

The circuit element layer DP-CL includes at least one insulating layer and a circuit element. The insulating layer includes at least one inorganic layer and at least one organic layer. The circuit element includes signal lines, pixel driver circuits, etc. The pixel driver circuits may include a transistor.

The display element layer DP-OLED includes a conductive partitioning wall and a light-emitting element. The light-emitting element includes an anode, a light-emitting pattern, and a cathode, and the light-emitting pattern may include at least a light-emitting layer. In an embodiment of the present disclosure, the light-emitting element may include at least one organic light-emitting diode OLED.

The encapsulation layer TFE includes a plurality of thin-films. Some thin-films are disposed to enhance optical efficiency, and the other thin-films are disposed to protect organic light-emitting diodes. In an embodiment of the present disclosure, the encapsulation layer TFE may include at least one inorganic layer. The encapsulation layer TFE may further include at least one organic layer. The inorganic layer protects the display element layer DP-OLED from moisture/oxygen, and the organic layer protects the display element layer DP-OLED from a foreign material such as a dust particle.

The input sensor INS acquires coordinate information of an external input. The input sensor INS may have a multi-layer structure. The input sensor INS may include a conductive single-layer or multi-layer. The input sensor INS may include an insulating single-layer or multi-layer. The input sensor INS may sense an external input, for example, in a capacitance scheme. For example, the input sensor INS may obtain coordinate information in a mutual capacitance scheme or a self-capacitance scheme. In the present disclosure, an operation scheme of the input sensor INS is not particularly limited, and in an embodiment of the present disclosure, the input sensor INS may sense an external input using an electromagnetic induction scheme or a pressure sensing scheme. In one example, in an embodiment of the present disclosure, the input sensor INS may be omitted.

As shown in FIG. 1B, the housing HAU may be combined with the window WP to configure an exterior of the display device DD. The housing HAU may be coupled to the window WP to provide a predetermined inner space. The display module DM may be accommodated in the inner space. In other words, the window WP may couple with the housing HAU to fix in place the display module DM.

The housing HAU may include a material with relatively high rigidity. For example, the housing HAU may include a plurality of frames and/or plates made of glass, plastic, or metal, or a combination thereof. The housing HAU may stably protect the components of the display device DD accommodated in the inner space from external impact. In FIG. 1B, the housing HAU integrally surrounds edges of the display module DM, but the present disclosure is not limited thereto. According to an embodiment of the present disclosure, the housing HAU may not be an integrated type, but may have a form in which two or more members are combined. In addition to the display module DM, components required to drive the display device DD, for example, a power supply unit, such as, for example, a battery, a circuit board, or the like, may be mounted inside the housing HAU. Also, according to an embodiment of the present disclosure, a sensor, such as a proximity sensor and/or an illumination sensor, may be mounted inside the housing HAU.

Figure 3:
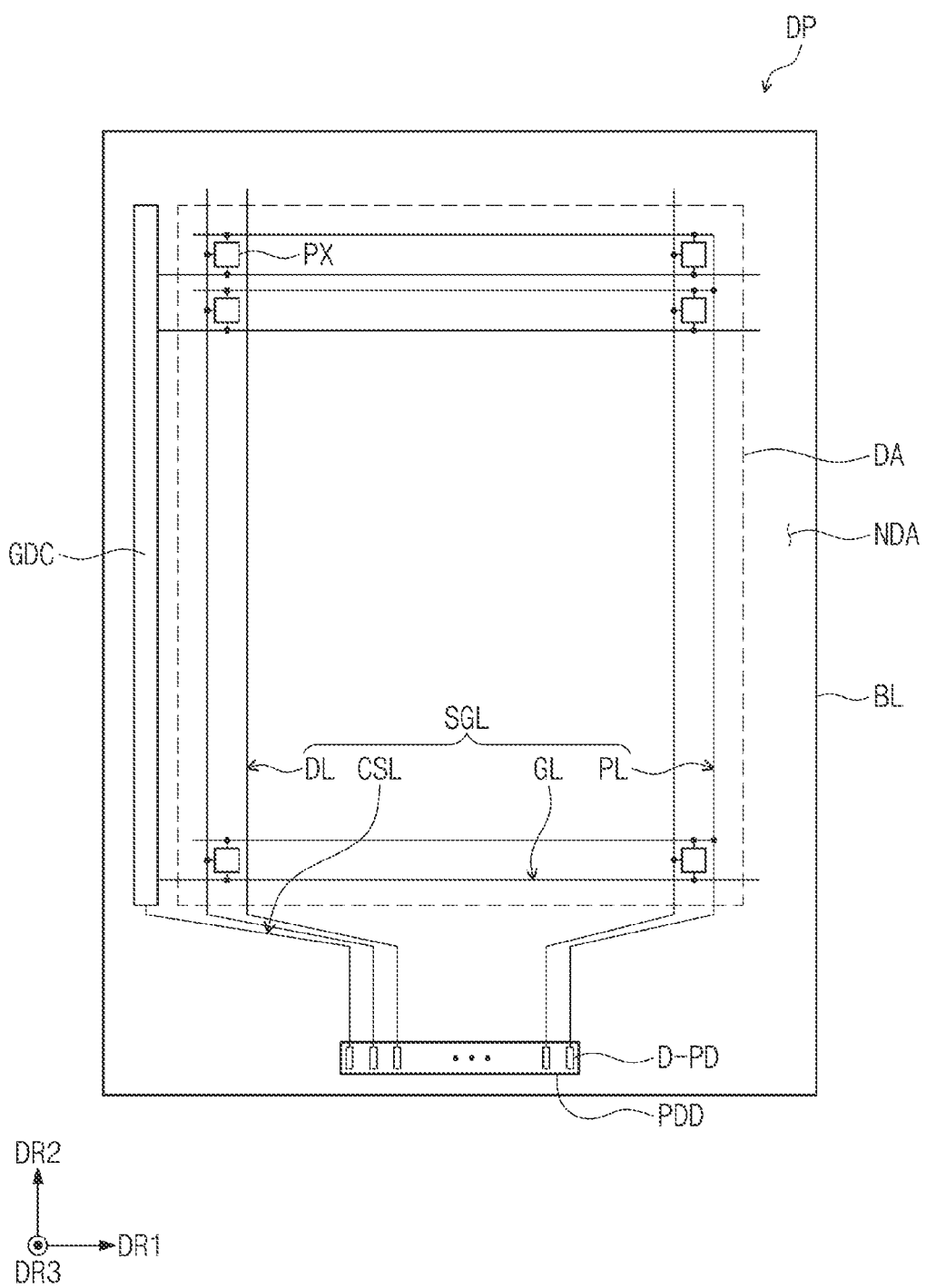
FIG. 3 is a plan view of a display panel according to an embodiment of the present disclosure.
Figure 4:
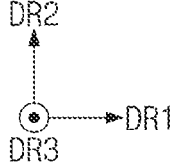
FIG. 4 is a plan view of an input sensor according to an embodiment of the present disclosure.
Figure 5A:
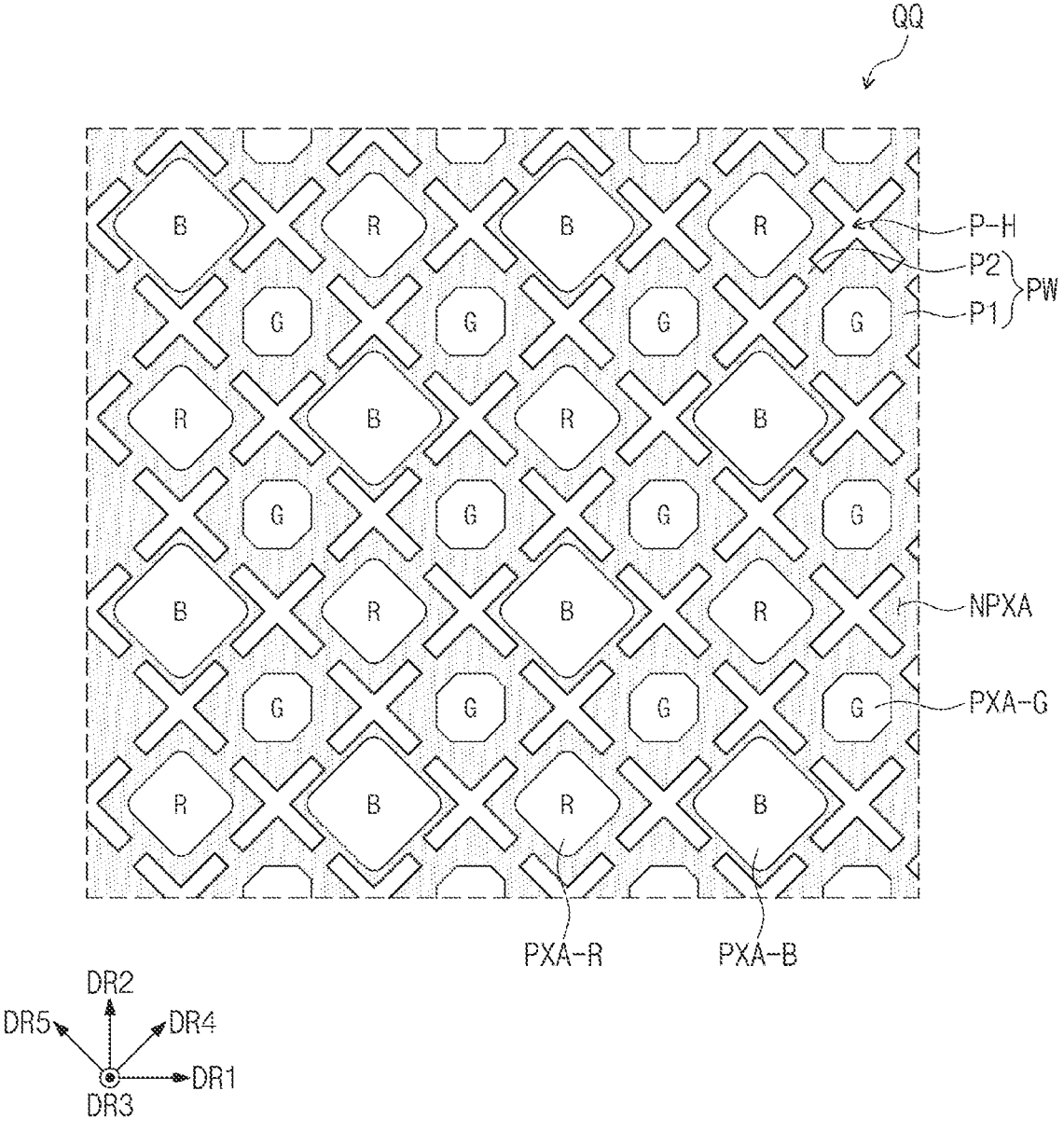
FIG. 5A and FIG. 5B are enlarged plan views of a QQ' area of FIG. 4.
Figure 5B:
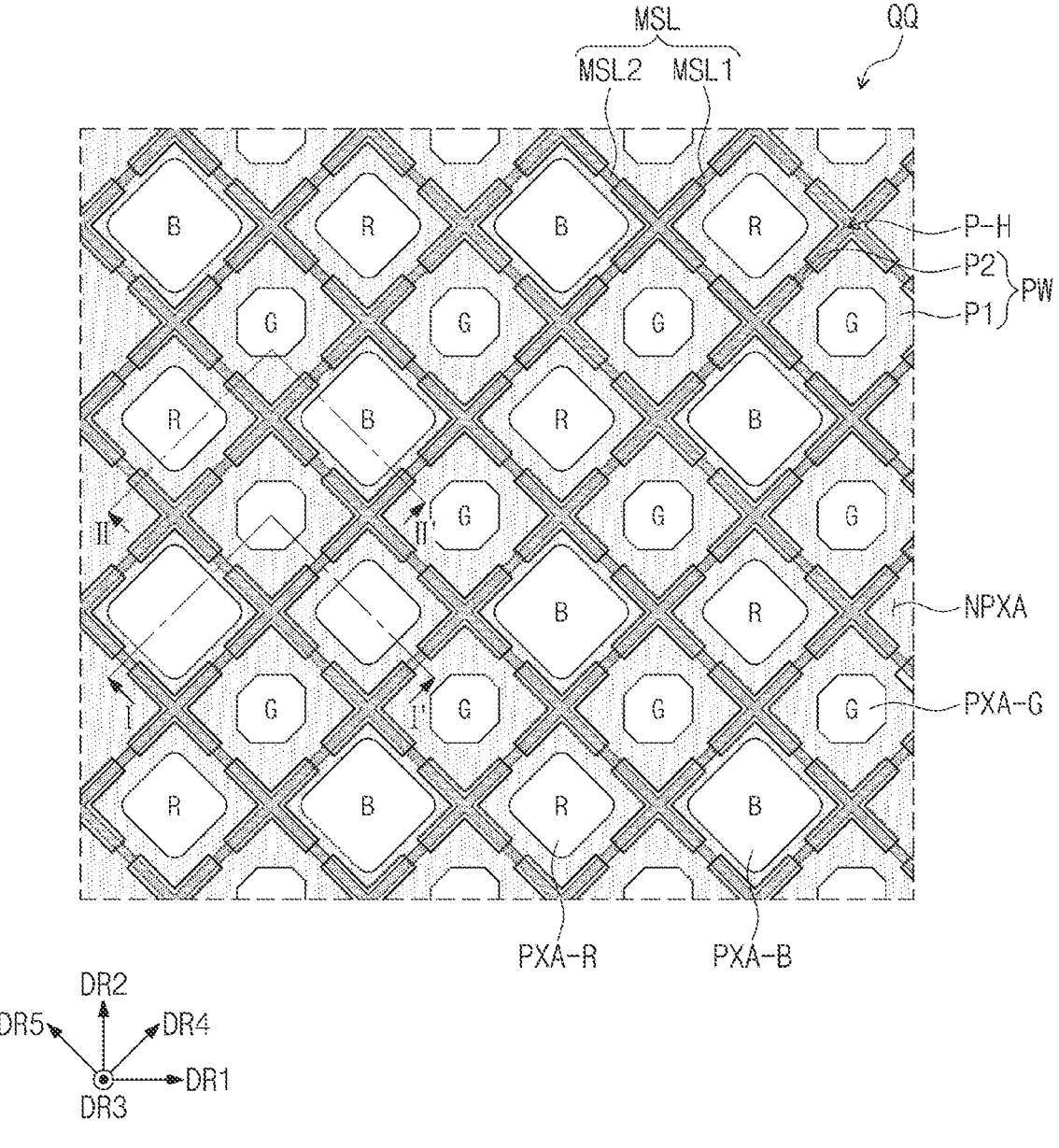
Figure 6:
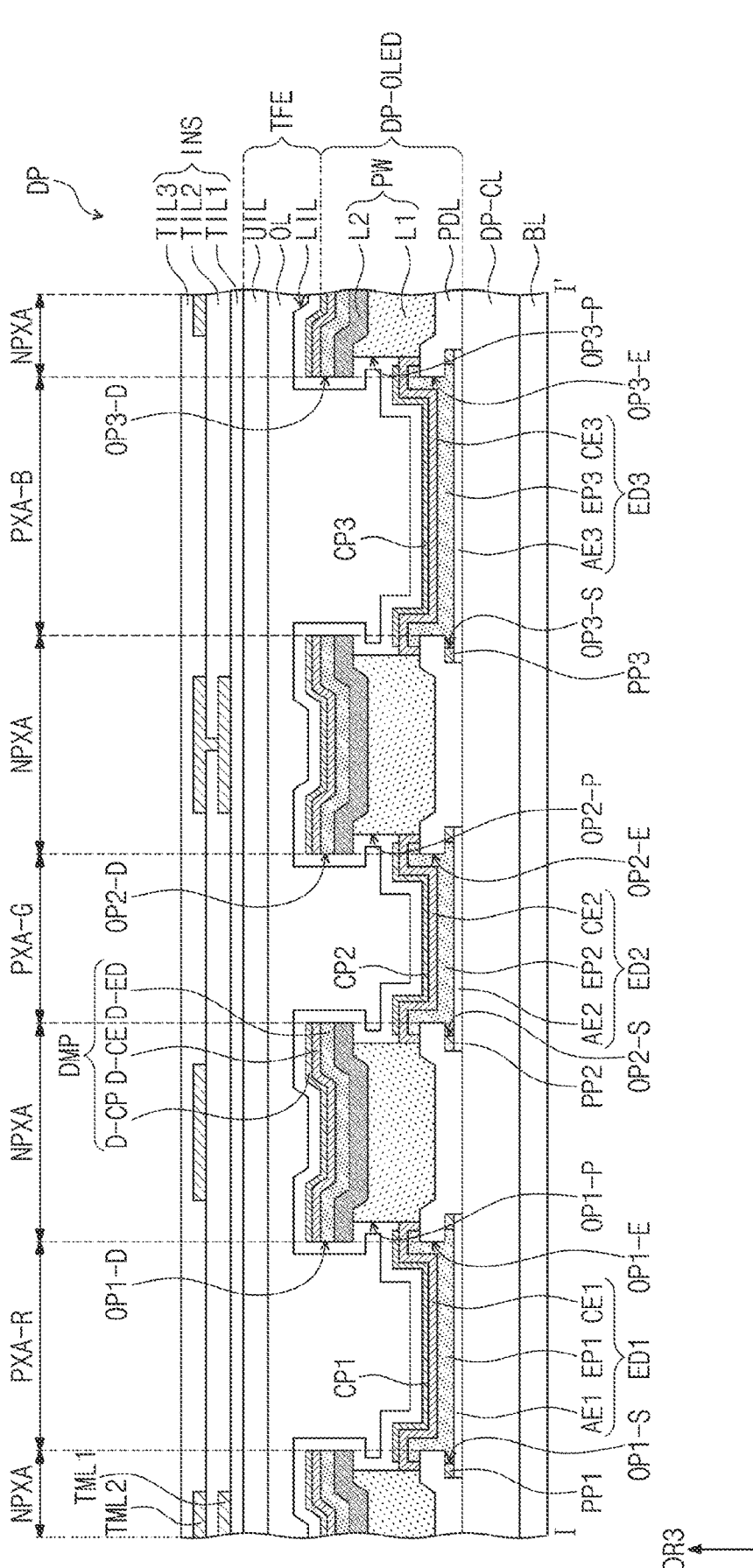
FIG. 6 is a cross-sectional view of a display panel cut along I-I' in FIG. 5B.
Figure 7:
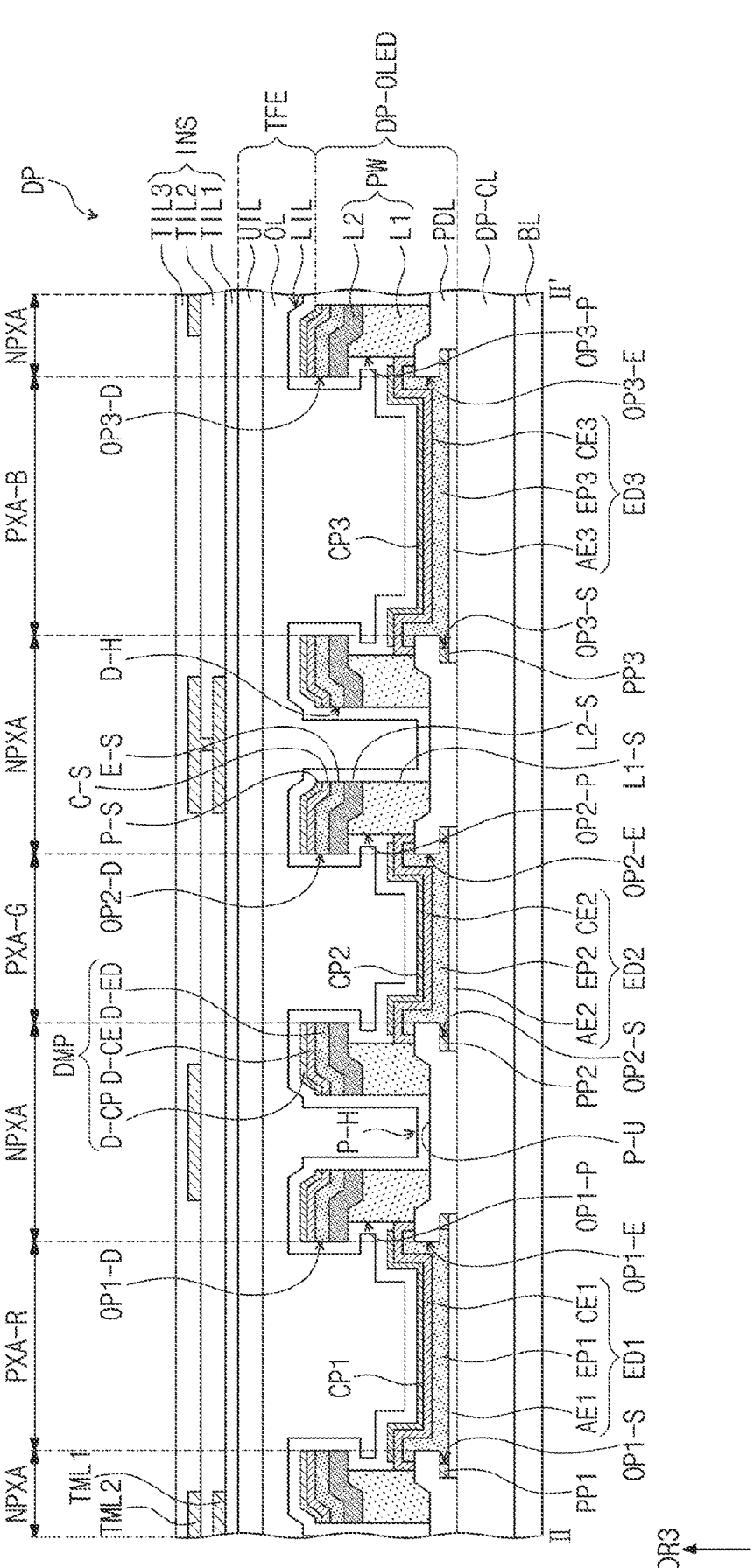
FIG. 7 is a cross-sectional view of a display panel cut along II-II' of FIG. 5B.

FIG. 3 is a plan view of a display panel according to an embodiment of the present disclosure. FIG. 4 is a plan view of an input sensor according to an embodiment of the present disclosure. FIG. 5A and FIG. 5B are enlarged plan views of a QQ' area in FIG. 4. FIG. 6 is a cross-sectional view of the display panel cut along I-I' in FIG. 5B. FIG. 7 is a cross-sectional view of the display panel cut along II-II' in FIG. 5B.

Referring to FIG. 3, the display panel DP may include the base layer BL divided into the display area DA and the non-display area NDA as described with reference to FIG. 2.

The display panel DP may include pixels PX disposed in the display area DA and signal lines SGL electrically connected to the pixels PX. The display panel DP may include a driver circuit GDC and a pad unit PDD disposed in the non-display area NDA.

The pixels PX may be arranged in the first direction DR1 and the second direction DR2. The pixels PX may include a plurality of pixel rows extending in the first direction DR1 and arranged in the second direction DR2, and a plurality of pixel columns extending in the second direction DR2 and arranged in the first direction DR1. In an embodiment of the present disclosure, the plurality of pixels PX may be arranged in a matrix structure or a pentile matrix structure, but the present disclosure is not limited thereto. For example, the plurality of pixels PX may be arranged in a stripe structure, a mosaic structure, or a delta structure.

The signal lines SGL may include gate lines GL, data lines DL, a power line PL, and a control signal line CSL. Each of the gate lines GL may be connected to a corresponding pixel of the pixels PX, and each of the data lines DL may be connected to a corresponding pixel of the pixels PX. The power line PL may be electrically connected to the pixels PX. The control signal line CSL may be connected to the driver circuit GDC to provide control signals to the driver circuit GDC. Each of the control signals provided by the control signal line CSL may include a vertical start signal for controlling the operation of the driver circuit GDC and at least one clock signal for determining the output timing of signals.

The driver circuit GDC may include a gate driver circuit. The gate driver circuit may generate gate signals and sequentially output the generated gate signals to the gate lines GL. The gate driver circuit may further output another control signal to the pixel driver circuit.

The pad unit PDD may be a part to which a separately provided flexible circuit board is connected. The pad unit PDD may include pixel pads D-PD, and the pixel pads D-PD may connect the flexible circuit board to the display panel DP. Each of the pixel pads D-PD may be connected to a corresponding signal line among the signal lines SGL. The pixel pads D-PD may be connected to corresponding pixels PX via the signal lines SGL. Further, one of the pixel pads D-PD may be connected to the driver circuit GDC. For example, the data lines DL, the power line PL, and the control signal line CSL of the signal lines SGL may be connected to a corresponding pad of pixel pads D-PD disposed in the non-display area NDA. The pixel pads D-PD may be adjacent to the lower end of the display panel DP.

Further, the pad unit PDD may further include input pads. The input pads may connect the flexible circuit board to the input sensor INS (see FIG. 2). However, the present disclosure is not limited thereto, and the input pads may be disposed in the input sensor INS (see FIG. 2) and connected to the pixel pads D-PD and a separate circuit board. Alternatively, the input sensor INS (see FIG. 2) may be omitted, and the input pads may not be further included therein.

Referring to FIG. 4, the input sensor INS may include a first sensing electrode TE1, a second sensing electrode TE2, a first signal line SL1, a second signal line SL2, and a sensing pad unit TDD including sensing pads T-PD.

The first sensing electrode TE1 extends along the second direction DR2. The first sensing electrode TE1 may include a plurality of first sensing electrodes which may be arranged along the first direction DR1. The first sensing electrode TE1 includes a plurality of first sensing patterns SP1 arranged along the second direction DR2, and first bridge patterns BP1, wherein each first bridge pattern BP1 is disposed between adjacent ones of the plurality of first sensing patterns SP1 so as to connect the adjacent ones of the first sensing patterns SP1 to each other. Two first sensing patterns SP1 disposed at opposite ends of one column of the first sensing electrodes TE1 may each be smaller in size than each of first sensing patterns SP1 disposed at the center, for example, may each have a size corresponding to half a size of each of the first sensing patterns SP1 disposed at the center.

The second sensing electrode TE2 may be disposed to be insulated from the first sensing electrode TE1. The second sensing electrode TE2 extends along the first direction DR1. The second sensing electrode TE2 may include a plurality of second sensing electrodes TE2 arranged along the second direction DR2. The second sensing electrode TE2 includes a plurality of second sensing patterns SP2 arranged along the first direction DR1, and second bridge patterns BP2, wherein each second bridge pattern BP2 is disposed between adjacent ones of the second sensing patterns SP2 so as to connect the adjacent ones of the second sensing patterns SP2 to each other. Two second sensing patterns SP2 disposed at opposite ends of one row of the second sensing electrodes TE2 may each be smaller in size than each of second sensing patterns SP2 disposed at the center, for example, may each have a size corresponding to half a size of each of the second sensing patterns SP2 disposed at the center.

The input sensor INS may sense an external input based on a sensing result of change in mutual capacitance between the first sensing electrode TE1 and the second sensing electrode TE2, or may sense an external input based on a sensing result of change in self-capacitance of each of the first sensing electrode TE1 and the second sensing electrode TE2. The input sensor INS according to an embodiment of the present disclosure may sense the external input in various schemes. The present disclosure is not limited to any one embodiment.

The first signal line SL1 is connected to the first sensing electrode TE1. The first signal line SL1 may be disposed in the non-display area NDA and may not be visible from an outside. The second signal line SL2 is connected to the second sensing electrode TE2. The second signal line SL2 may be disposed in the non-display area NDA and may not be visible from the outside.

In one example, in this embodiment, one first sensing electrode TE1 may be connected to two first signal lines. One end and the other end of one first sensing electrode TE1 may be respectively connected to different first signal lines SL1 and may be respectively connected to two first pads. Accordingly, even though the first sensing electrode TE1 has a relatively larger length than that of the second sensing electrode TE2, an electrical signal may be uniformly applied to an entire area. Therefore, the input sensor INS may provide a uniform external input sensing environment to the entire active area AA regardless of its shape. In other words, since the first sensing electrodes TE1 are longer than the second sensing electrodes TE2, a voltage drop of a detection signal (or a transmission signal) occurs, and thus, sensing sensitivity may be reduced. Thus, two first signal lines SL1 are respectively connected to two opposite ends of the first sensing electrodes TE1, a voltage drop of a detection signal (or a transmission signal) may be prevented and thus reduction of sensing sensitivity may be prevented.

One first sensing electrode TE1 may be connected to two first signal lines as shown in FIG. 4 and described above, but the present disclosure is not limited thereto. For example, the second sensing electrode TE2 may also be connected to two second signal lines, or each of the first sensing electrode TE1 and the second sensing electrode TE2 may be connected to only one signal line. The input sensor INS according to an embodiment of the present disclosure may operate in various schemes. The present disclosure is not limited to any one embodiment.

The sensing pad unit TDD may be a part to which a separately provided flexible circuit board is connected. The signal lines SL1 and SL2 may be respectively connected to corresponding pads of the sensing pads T-PD disposed in the non-display area NDA. The sensing pads T-PD of the sensing pad unit TDD are connected to pads included in a flexible circuit board.

FIG. 5A shows an arrangement relationship in a plan view of light-emitting areas PXA-R, PXA-G, and PXA-B and a partitioning wall PW included in the display panel DP (see FIG. 3). FIG. 5B shows an arrangement relationship in a plan view of conductive lines MSL and the partitioning wall PW included in the input sensor INS (see FIG. 4).

Referring to FIG. 5A, the display panel DP (see FIG. 3) according to an embodiment of the present disclosure may include the light-emitting areas PXA-R, PXA-G, and PXA-B providing light of different colors, and a non-light-emitting area NPXA adjacent to the light-emitting areas PXA-R, PXA-G, and PXA-B. An area size of each of the light-emitting areas PXA-R, PXA-G, and PXA-B may correspond to an area size of each of anodes AE1, AE2, and AE3 exposed through each of openings OP defined in a pixel defining layer PDL (see FIG. 6) as described later. The light-emitting areas PXA-R, PXA-G, and PXA-B may have different areas based on colors of light emitted therefrom. For example, the pixel PX of the light-emitting area PXA-R may generate the red light, the pixel PX of the light-emitting area PXA-G may generate the green light, and the pixel PX of the light-emitting area PXA-B may generate the blue light. The non-light-emitting area NPXA may be defined as an area between the light-emitting areas PXA-R, PXA-G, and PXA-B and may overlap with the pixel defining layer PDL (see FIG. 6). The shape of the light-emitting areas PXA-R, PXA-G, and PXA-B may be generally, for example, an octagon, a square or a diamond with or without rounded corners. It is, however, to be understood that the present disclosure is not limited thereto. For example, the shape of the light-emitting areas PXA-R, PXA-G, and PXA-B may be a circle, or other polygons with or without rounded corners. The light-emitting areas PXA-R. PXA-G, and PXA-B may have different shapes and/or sizes from each other.

The partitioning wall PW may be disposed on the pixel defining layer PDL (see FIG. 6). According to the present disclosure, the partitioning wall PW may be a structure for electrically connecting cathodes CE1, CE2, and CE3 respectively patterned in light-emitting elements ED1, ED2, and ED3 to each other. Accordingly, the partitioning wall PW may include a conductive material, and a description thereof will be described later.

The partitioning wall PW may non-overlap with the light-emitting areas PXA-R, PXA-G, and PXA-B and may overlap with the non-light-emitting area NPXA in a plan view. The partitioning wall PW may include first patterns P1 and second patterns P2 in a plan view. Each of the first patterns P1 may surround corresponding one of the light-emitting areas PXA-R, PXA-G, and PXA-B. Each of the second patterns P2 may be disposed between adjacent ones of the light-emitting areas PXA-R, PXA-G, and PXA-B. In this embodiment, one second pattern P2 may be disposed between adjacent ones of the light-emitting areas PXA-R, PXA-G, and PXA-B.

Around one first light-emitting area PXA-R, one second pattern P2 may be disposed between the second light-emitting area PXA-G and the first light-emitting area PXA-R spaced apart from each other in a fifth direction DR5. Further, one second pattern P2 may be disposed between the first light-emitting area PXA-R and the second light-emitting area PXA-G spaced apart from each other in a fourth direction DR4. The fourth direction DR4 and the fifth direction DR5 may be two diagonal directions perpendicular to each other. However, the present disclosure is not limited thereto. Therefore, around one first light-emitting area PXA-R, one first pattern P1 surrounding the first light-emitting area PXA-R, and four second patterns P2 extending from the first pattern P1 in the fourth direction DR4 and the fifth direction DR5 may be disposed. For example, two second patterns P2 may be disposed at two opposite sides (i.e., one second pattern P2 on each side) of the first light-emitting area PXA-R in the fourth direction DR4, and two second patterns P2 may be disposed at two opposite sides (i.e., one second pattern P2 on each side) of the first light-emitting area PXA-R in the fifth direction DR5.

The partitioning wall PW may include line patterns P-H extending through at least a portion of the partitioning wall PW. In this embodiment, each of the line patterns P-H may have an 'X' shape in a plan view. In this embodiment, one second pattern P2 may be disposed between the line patterns P-H adjacent to each other in the fourth direction DR4 or the fifth direction DR5. In other words, the line patterns P-H may be defined in the partitioning wall PW by removing at least a portion of the partitioning wall PW, in which the line patterns P-H overlap the non-light-emitting area NPXA. Each of the line patterns P-H may be disposed between two adjacent ones of the light-emitting areas PXA-R, PXA-G, and PXA-B in the first direction DR1, and may be disposed between two adjacent ones of the light-emitting areas PXA-R. PXA-G, and PXA-B in the second direction DR2. Thus, each of the line patterns P-H may be disposed between four of the light-emitting areas PXA-R, PXA-G, and PXA-B, and accordingly, may be disposed between four of the cathodes CE1, CE2, and CE3 and may have an 'X' shape in a plan view of the display device DD.

Referring to FIG. 5B, the input sensor INS (see FIG. 4) may include the conductive lines MSL. The conductive lines MSL may include first conductive lines MSL1 extending in the fourth direction DR4 and second conductive lines MLS2 extending in the fifth direction DR5. The first conductive lines MSL1 and the second conductive lines MLS2 may be alternately arranged with each other. The conductive lines MSL may non-overlap the light-emitting areas PXA-R, PXA-G, and PXA-B and may overlap the non-display area NPXA.

The first conductive lines MSL1 and the second conductive lines MLS2 may constitute the first sensing patterns SP1, the second sensing patterns SP2, and the second bridge patterns BP2 as illustrated in FIG. 4. In an embodiment of the present disclosure, the first conductive lines MSL1 and the second conductive lines MLS2 may form a mesh pattern of the sensing electrodes TE1 and TE2, and the mesh pattern does not interfere with emission of light and is not seen by a viewer because it does not overlap with the light-emitting areas PXA-R, PXA-G, and PXA-B.

According to the present disclosure, at least some of the conductive lines MSL may overlap the line patterns P-H defined in the partitioning wall PW. As the second patterns P2 are disposed between the line patterns P-H, the second patterns P2 may overlap with corresponding conductive lines among the first conductive lines MSL1 and the second conductive lines MLS2. The line patterns P-H non-overlap with the second patterns P2.

According to the present disclosure, the partitioning wall PW includes a conductive material. Thus, as a size of an area where the conductive lines MSL disposed on the partitioning wall PW overlap with the partitioning wall PW increases, parasitic capacitance between the conductive lines MSL and the partitioning wall PW may occur. According to the present disclosure, the first conductive lines MSL1 and the second conductive lines MLS2 may not overlap the first patterns P1 of the partitioning wall PW but may overlap the second patterns P2 of the partitioning wall PW. A significant area of each of the first conductive lines MSL1 and the second conductive lines MLS2 may overlap with the line patterns P-H obtained by removing a portion of the partitioning wall PW. In other words, the line patterns P-H do not contain conductive materials because the conductive material of the partitioning wall PW is removed in the line patterns P-H. Accordingly, an overlapping area between the partitioning wall PW and the conductive lines MSL may be minimized such that the parasitic capacitance between the conductive lines MSL and the partitioning wall PW may be reduced.

In FIG. 6 and FIG. 7, one first light-emitting area PXA-R, one second light-emitting area PXA-G, and one third light-emitting area PXA-B are illustrated in an enlarged manner. FIG. 6 is a cross-sectional view of a non-overlapping area with the line patterns P-H defined in the partitioning wall PW as illustrated in FIG. 5B. FIG. 7 is a cross-sectional view of an overlapping area with the line patterns P-H defined in the partitioning wall PW as illustrated in FIG. 5B.

Referring to FIG. 6 and FIG. 7, the display panel DP according to the present embodiment may include the base layer BL, the circuit element layer DP-CL, the display element layer DP-OLED, and the encapsulation layer TFE. The display element layer DP-OLED may include the light-emitting elements ED1, ED2, and ED3, sacrificial patterns PP1, PP2, and PP3, the pixel defining layer PDL, the partitioning wall PW, and dummy patterns DMP. The circuit element layer DP-CL may include at least one transistor connected to each of the light-emitting elements ED1, ED2, and ED3 included in the display element layer. A structure of the at least one transistor is not limited to any one embodiment as long as it can drive the pixel PX (see FIG. 3). The light-emitting elements ED1, ED2, and ED3 may include the first light-emitting element ED1, the second light-emitting element ED2, and the third light-emitting element ED3.

The first light-emitting element ED1 may include the first anode AE1, a first light-emitting pattern EP1, and the first cathode CE1. The second light-emitting element ED2 may include the second anode AE2, a second light-emitting pattern EP2, and the second cathode CE2. The third light-emitting element ED3 may include the third anode AE3, a third light-emitting pattern EP3, and the third cathode CE3. In an embodiment of the present disclosure, the first light-emitting pattern EP1 may provide red light in the first light-emitting area PXA-R, the second light-emitting pattern EP2 may provide green light in the second light-emitting area PXA-G, and the third light-emitting pattern EP3 may provide blue light in the third light-emitting area PXA-B.

The first to third anodes AE1, AE2, and AE3 may be provided in a plurality of patterns. The first to third anodes AE1, AE2, and AE3 may be conductive. For example, each of the first to third anodes AE1, AE2, and AE3 may be made of various materials as long as they may be conductive. An example thereof may include a metal, a transparent conductive oxide (TCO), or a conductive polymer material. The transparent conductive oxide (TCO) may include, for example, indium tin oxide (ITO), indium zinc oxide (IZO), zinc oxide (ZnO), indium oxide ($In_2O_3$), indium gallium oxide (IGO), or aluminum zinc oxide (AZO). However, the present disclosure is not limited thereto.

Each of the first to third anodes AE1, AE2, and AE3 is shown as being embodied as a single layer. However, this is shown by way of example. Each of the first to third anodes AE1, AE2, and AE3 may have a multi-layer structure. In an embodiment of the present disclosure, each of the first to third anodes AE1, AE2, and AE3 may have, but is not limited to, a multi-layer structure of indium tin oxide/ magnesium (ITO/Mg), indium tin oxide/magnesium fluoride ($ITO/MgF_2$), indium tin oxide/silver (ITO/Ag), or indium tin oxide/silver/indium tin oxide (ITO/Ag/ITO). One of the first to third anodes AE1, AE2, and AE3 may have a single-layer structure, and the others thereof may have a multi-layer structure. The present disclosure is not limited to any one embodiment.

The first to third light-emitting patterns EP1, EP2, and EP3 may be disposed on the first to third anodes AE1, AE2, and AE3, respectively. The first to third light-emitting patterns EP1, EP2, and EP3 may be patterned so as to be defined by a tip of the partitioning wall PW as described later.

The first to third cathodes CE1, CE2, and CE3 may be provided in a plurality of patterns. The first to third cathodes CE1, CE2, and CE3 may be conductive. For example, each of the first to third cathodes CE1, CE2, and CE3 may be made of various materials as long as they may be conductive. An example thereof may include a metal, transparent conductive oxide (TCO), or a conductive polymer material.

The pixel defining layer PDL may be an inorganic insulating film. For example, the pixel defining layer PDL may include, for example, silicon oxide ($SiO_x$), silicon nitride ($SiN_x$), or a combination thereof. For example, the pixel defining layer PDL may have a two-layer structure in which a silicon oxide ($SiO_x$) layer and a silicon nitride ($SiN_x$) layer are sequentially stacked on top each other. However, this is an example. As long as the pixel defining layer PDL may be an inorganic insulating film, the material thereof, and whether the pixel defining layer PDL has the single layer structure, or the multilayer structure may be variously changed. The present disclosure is not limited to any one embodiment. The pixel defining layer PDL may be formed to separate the first to third anodes AE1, AE2, and AE3 from each other, and may be formed to cover the edges of the first to third anodes AE1, AE2, and AE3.

In this embodiment, first to third light-emitting openings OP1-E, OP2-E, and OP3-E may be defined in the pixel defining layer PDL. The first light-emitting opening OP1-E may expose at least a portion of the first anode AE1. The first light-emitting area PXA-R may be defined as an area of an upper surface of the first anode AE1 as exposed through the first light-emitting opening OP1-E. The second light-emitting opening OP2-E may expose at least a portion of the second anode AE2. The second light-emitting area PXA-G may be defined as an area of an upper surface of the second anode AE2 as exposed through the second light-emitting opening OP2-E. The third light-emitting opening OP3-E may expose at least a portion of the third anode AE3. The third light-emitting area PXA-B may be defined as an area of an upper surfaces of the third anode AE3 as exposed through the third light-emitting opening OP3-E. The three types of light-emitting openings OP1-E, OP2-E, and OP3-E are distinguished from each other according to their sizes and shapes, and the size and shape of each of the first light-emitting opening OP1-E, the second light-emitting opening OP2-E, and the third light-emitting opening OP3-E may be proportional to a size and shape of a light emitting area of a corresponding pixel. For example, each of the three types of light emitting openings OP1-E, OP2-E, and OP3-E may be proportional to the size and shape of each of the three light-emitting areas PXA-R, PXA-G and PXA-B, respectively.

The display panel DP according to an embodiment of the present disclosure may further include the sacrificial patterns PP1, PP2, and PP3. The sacrificial patterns PP1, PP2, and PP3 may include the first sacrificial pattern PP1, the second sacrificial pattern PP2, and the third sacrificial pattern PP3. The first to third sacrificial patterns PP1, PP2, and PP3 may be disposed on edges of the first to third anodes AE1, AE2, and AE3, respectively. The first to third sacrificial patterns PP1, PP2, and PP3 may be respectively covered with corresponding first to third light-emitting patterns EP1, EP2, and EP3 and the pixel defining layer PDL. Each of the first to third sacrificial patterns PP1, PP2, and PP3 may include an amorphous transparent conductive oxide.

The first to third sacrificial patterns PP1, PP2, and PP3 may be formed via a wet etching process. The etching process for forming the first to third sacrificial patterns PP1, PP2, and PP3 may be performed in an environment where a difference between etching selectivity of each of the first to third sacrificial patterns PP1, PP2, and PP3 and each of the first to third anodes AE1, AE2, and AE3 is large. Accordingly, each of the first to third sacrificial patterns PP1, PP2, and PP3 may be prevented from being etched together with each of the first to third anodes AE1, AE2, and AE3. That is, each of the first to third sacrificial patterns PP1, PP2, and PP3 with an etch rate higher than that of each of the first to third anodes AE1, AE2, and AE3 may be disposed between the pixel defining layer PDL and each of the first to third anodes AE1, AE2, and AE3, thus preventing each of the first to third anodes AE1, AE2, and AE3 from being etched together therewith and from being damaged during the etching process.

Each of first to third sacrificial openings OP1-S. OP2-S, and OP3-S exposing at least a portion of corresponding one of the first to third anodes AE1, AE2, and AE3, may be defined in each of the first to third sacrificial patterns PP1, PP2, and PP3. The first to third sacrificial openings OP1-S, OP2-S, and OP3-S may overlap with the corresponding first to third light-emitting openings OP1-E, OP2-E, and OP3-E, respectively.

In the present embodiment, the partitioning wall PW may have first to third partitioning wall openings OP1-P, OP2-P, and OP3-P defined therein respectively corresponding to the first to third light-emitting openings OP1-E, OP2-E, and OP3-E. The first to third partitioning wall openings OP1-P. OP2-P, and OP3-P may overlap with corresponding light-emitting areas PXA-R, PXA-G, and PXA-B, respectively.

The first light-emitting opening OP1-E and the first partitioning wall opening OP1-P may be aligned with each other along the third direction DR3. The first light-emitting element ED1 may be disposed in the first light-emitting opening OP1-E and the first partitioning wall opening OP1-P. The second light-emitting opening OP2-E and the second partitioning wall opening OP2-P may be aligned with each other along the third direction DR3. The second light-emitting element ED2 may be disposed in the second light-emitting opening OP2-E and the second partitioning wall opening OP2-P. The third light-emitting opening OP3-E and the third partitioning wall opening OP3-P may be aligned with each other along the third direction DR3. The third light-emitting element ED3 may be disposed in the third light-emitting opening OP3-E and the third partitioning wall opening OP3-P.

The partitioning wall PW may include a lower layer L1 disposed on the pixel defining layer PDL and an upper layer L2 disposed on the lower layer L1. The lower layer L1 may include a conductive material. For example, the lower layer L1 may include a transparent conductive oxide (TCO), a metal, or a combination thereof. For example, the metal may include gold (Au), silver (Ag), aluminum (Al), magnesium (Mg), lithium (Li), molybdenum (Mo), titanium (Ti), copper (Cu), or an alloy thereof. The transparent conductive oxide may include, for example, indium tin oxide (ITO), indium zinc oxide (IZO), zinc oxide (ZnO), indium oxide (In$_2$O$_3$), indium gallium oxide (IGO), indium gallium zinc oxide (IGZO) or aluminum zinc oxide (AZO).

The upper layer L2 may be disposed on the lower layer L1. The upper layer L2 may include a metal or a non-metal material. For example, the metal may include, for example, gold (Au), silver (Ag), aluminum (Al), magnesium (Mg), lithium (Li), molybdenum (Mo), titanium (Ti), copper (Cu), or an alloy thereof. The non-metal material may include, for example, silicon (Si), silicon oxide (SiO$_x$), silicon nitride (SiN$_x$), silicon oxynitride (SiON), a metal oxide, a metal nitride, or a combination thereof.

In an embodiment of the present disclosure, the lower layer L1 of the partitioning wall PW may include a conductive material and may be disposed on the pixel defining layer PDL, and the upper layer L2 of the partitioning wall may be disposed on the lower layer L1 and may include a conductive material. For example, in an embodiment of the present disclosure, the lower layer L1 may include aluminum (Al), and the upper layer L2 may include titanium (Ti).

According to an embodiment of the present disclosure, a thickness of the lower layer L1 may be greater than a thickness of the upper layer L2. Further, in a cross-sectional view, a width of the lower layer L1 may be smaller than a width of the upper layer L2. Accordingly, the lower layer L1 and the upper layer L2 may be stacked on top of each other so as to form an undercut shape in a cross-sectional view. A protruding portion of the upper layer L2 beyond the lower layer L1 may be defined as the tip. For example, the upper layer L2 may have two overhang portions above the lower layer L1.

The first to third light-emitting patterns EP1, EP2, and EP3 may be isolated from each other via the tip of the partitioning wall PW and may be respectively disposed in the first to third light-emitting openings OP1-E, OP2-E, and OP3-E and the first to third partitioning wall openings OP1-P, OP2-P, and OP3-P. The first to third cathodes CE1, CE2, and CE3 may be isolated from each other via the tip of the partitioning wall PW and may be respectively disposed in the first to third partitioning wall openings OP1-P, OP2-P, and OP3-P. According to the present disclosure, individually patterned first to third cathodes CE1, CE2, and CE3 may directly contact a side surface of the lower layer L1. Since the lower layer L1 is conductive, the first to third cathodes CE1, CE2, and CE3 may be electrically connected to each other.

The first to third cathodes CE1, CE2, and CE3 may be physically isolated from each other via the upper layer L2 constituting the tip and may be respectively disposed in the first to third light-emitting openings OP1-E, OP2-E, and OP3-E. The first to third cathodes CE1, CE2, and CE3 may contact the lower layer L1 and thus may be electrically connected to each other and thus may receive a common voltage. The lower layer L1 may have a relatively high electrical conductivity and a large thickness compared to those of the upper layer L2, so that contact resistance of the lower layer L1 with the first to third cathodes CE1, CE2, and CE3 may be reduced. Accordingly, a common cathode voltage may be uniformly provided to the light-emitting areas PXA-R, PXA-G, and PXA-B.

According to the present disclosure, the plurality of first to third light-emitting patterns EP1, EP2, and EP3 may be deposited and patterned on a pixel basis so as to be defined by the tip of the partitioning wall PW. That is, the first to third light-emitting patterns EP1, EP2, and EP3 may be commonly deposited using an open mask, and then may be easily patterned so as to be defined by the partitioning wall PW on a pixel basis.

On the contrary to the present disclosure, when the first to third light-emitting patterns EP1, EP2, and EP3 are patterned using a fine metal mask (FMM), a support spacer protruding from a conductive partitioning wall so as to support the fine metal mask (FMM) should be provided. In other words, additional processes and structures are required in this approach in forming the first to third light-emitting patterns EP1, EP2, and EP3. Further, the fine metal mask (FMM) may be spaced apart from a base surface on which the patterning is performed by a height of a combination of the partitioning wall and the spacer, such that it may be difficult to realize high resolution. Further, as the fine metal mask (FMM) comes into contact with the spacer, foreign substances may remain on the spacer after the patterning process has been performed on the light-emitting patterns, or the spacer may be damaged due to impression of the fine metal mask (FMM). Accordingly, a defective display panel may be formed.

According to the present embodiment, the physical isolation between the light-emitting elements ED1, ED2, and ED3 may be easily achieved via the partitioning wall PW including the conductive material. Accordingly, current leakage between adjacent ones of the light-emitting areas PXA-R, PXA-G, and PXA-B may not occur, and thus, an operation error may be prevented, and an independent operation of each of the light-emitting elements ED1, ED2, and ED3 may be achieved.

Further, in manufacturing a large-area display panel DP according to an embodiment of the present disclosure, a large-area mask production may be omitted, such that a process cost may be reduced, and a defect that may occur in the large-area mask may be reduced or removed, thus providing the display panel DP with enhanced process reliability.

The display panel DP according to an embodiment of the present disclosure may further include capping patterns CP1, CP2, and CP3. The capping patterns CP1, CP2, and CP3 may include the first capping pattern CP1, the second capping pattern CP2, and the third capping pattern CP3. The first to third capping patterns CP1, CP2, and CP3 may be disposed on the first to third cathodes CE1, CE2, and CE3, respectively, and in the first to third partitioning wall openings OP1-P, OP2-P, and OP3-P, respectively. Each of the first to third capping patterns CP1, CP2, and CP3 may include an inorganic material. For example, the first to third capping patterns CP1, CP2, and CP3 may be respectively disposed on corresponding first to third cathodes CE1, CE2, and CE3 and covered with a first inorganic layer LIL to be described.

The display panel DP according to an embodiment of the present disclosure may further include the dummy pattern DMP. The dummy pattern DMP may include a first pattern D-ED, a second pattern D-CE, and a third pattern D-CP sequentially stacked on the upper layer L2 of the partitioning wall PW. The first pattern D-ED may include a material the same as that of each of the first to third light-emitting patterns EP1, EP2, and EP3 and may be formed in a process the same as that in which the first to third light-emitting patterns EP1, EP2, and EP3 are formed.

The second pattern D-CE may include a material the same as that of each of the first to third cathodes CE1, CE2, and CE3 and may be formed in a process the same as that in which the first to third cathodes CE1, CE2, and CE3 are formed.

The third pattern D-CP may include a material the same as that of each of the first to third capping patterns CP1, CP2, and CP3 and may be formed in a process the same as that in which the first to third capping patterns CP1, CP2, and CP3 are formed.

First to third dummy openings OP1-D, OP2-D, and OP3-D respectively corresponding to the first to third light-emitting openings OP1-E, OP2-E, and OP3-E may be defined in the dummy pattern DMP.

According to an embodiment of the present disclosure, a width of each of openings of the lower layer L1 included in some of the first to third partitioning wall openings OP1-P, OP2-P, and OP3-P may be larger than a width of each of openings of the upper layer L2 included in some of the first to third partitioning wall openings OP1-P, OP2-P, and OP3-P, and may be larger than a width of each of the first to third dummy openings OP1-D, OP2-D, and OP3-D. For example, a width of an opening of the lower layer L1 in one first partitioning wall opening OP1-P may be larger than a width of an opening of the upper layer L2 in the same one first partitioning wall opening OP1-P, and may be larger than a width of a corresponding one (which overlaps one first partitioning wall opening OP1-P) of the first dummy opening OP1-D. According to the present embodiment, each of the lower layer L1, the upper layer L2, the first pattern D-ED, the second pattern D-CE, and the third pattern D-CP may include an opening defined therein overlapping corresponding one of the light-emitting areas PXA-R, PXA-G, and PXA-B. A width of the opening defined in the lower layer L1 may be greater than each of a width of the opening defined in the upper layer L2, a width of the opening defined in the first pattern D-ED, a width of the opening defined in the second pattern D-CE, and a width of the opening defined in the third pattern D-CP.

The encapsulation layer TFE may include a first inorganic layer LIL, an organic layer OL, and a second inorganic layer UIL sequentially stacked. The first inorganic layer LIL may cover the light-emitting elements ED1, ED2, and ED3. The first inorganic layer LIL may prevent external moisture or oxygen from invading the light-emitting elements ED1, ED2, and ED3. The first inorganic layer LIL may include an inorganic material. For example, the first inorganic layer LIL may include silicon nitride ($SiN_x$), silicon oxide ($SiO_x$), or a combination thereof. The first inorganic layer LIL may be formed via a chemical vapor deposition (CVD) process.

The organic layer OL may be disposed on the first inorganic layer LIL so as to contact the first inorganic layer LIL. The organic layer OL may provide a flat surface on the first inorganic layer LIL. Curves formed on an upper surface of the first inorganic layer LIL or particles existing on the first inorganic layer LIL may be covered with the organic layer OL, thus preventing a surface state of the upper surface of the first inorganic layer LIL from affecting components formed on the organic layer OL. Further, the organic layer OL may relieve stress between layers in contact with each other. The organic layer OL may include an organic material and may be formed via a solution process such as spin coating, slit coating, or inkjet process. The organic layer OL may include a polymer-based material. Examples of the polymer-based material may include, for example, an acrylic resin, an epoxy resin, polyimide, and polyethylene. However, the present disclosure is not limited thereto.

The second inorganic layer UIL is disposed on the organic layer OL so as to cover the organic layer OL. The second inorganic layer UIL may be stably formed on a relatively flat surface of the organic layer OL compared to a case in which the second inorganic layer UIL is disposed on the first inorganic layer LIL. The second inorganic layer UIL may encapsulate moisture emitted from the organic layer OL and prevent the moisture from entering the outside. The second inorganic layer UIL may include silicon nitride ($SiN_x$), silicon oxide ($SiO_x$), or a combination thereof. The second inorganic layer UIL may be formed via a chemical vapor deposition (CVD) process. In the present embodiment, each of the first inorganic layer LIL, the organic layer OL, and the second inorganic layer UIL is shown as a single layer, but the present disclosure is not limited thereto. For example, in an embodiment of the present disclosure, at least one of the first inorganic layer LIL, the organic layer OL, or the second inorganic layer UIL may be provided in plurality or may be omitted.

The input sensor INS is disposed on the encapsulation layer TFE. The input sensor INS may be directly disposed on the encapsulation layer TFE. The encapsulation layer TFE and the input sensor INS may be formed in a consecutive process. The input sensor INS may sense an external input in any one scheme of a self-capacitance scheme and a mutual capacitance scheme. In an embodiment of the present disclosure, the input sensor INS is not limited to one of the mutual capacitance scheme and the self-capacitance scheme in sensing an external input. The input sensor ISP may sense an external input by using both the mutual capacitance scheme and the self-capacitance scheme.

The conductive patterns included in the input sensor INS may be variously modified, arranged, and connected according to the applied scheme.

The input sensor INS may include at least one sensing insulating layer TIL1, TIL2, or TIL3 and at least one conductive layer TML1 or TML2 (conductive pattern). The at least one sensing insulating layer TIL1, TIL2, or TIL3 may include the first sensing insulating layer TIL1, the second sensing insulating layer TIL2, or the third sensing insulating layer TIL3. Each of the first sensing insulating layer TIL1, the second sensing insulating layer TIL2, and the third sensing insulating layer TIL3 may include inorganic material or organic material.

According to an embodiment of the present disclosure, the first sensing insulating layer TIL1 may be directly disposed on the second inorganic layer UIL of the encapsulation layer TFE. The first conductive layer TML1 is disposed on the first sensing insulating layer TIL1. The second sensing insulating layer TIL2 may be disposed on the first sensing insulating layer TIL and cover the first conductive layer TML1. The second conductive layer TML2 is disposed on the second sensing insulating layer TIL2. The third sensing insulating layer TIL3 may be disposed on the second sensing insulating layer TIL2 and cover the second conductive layer TML2. The second sensing insulating layer TIL2 may be disposed between the first conductive layer TML1 and the second conductive layer TML2.

Each of the conductive layers TML1 and TML2 according to an embodiment of the present disclosure may have a single-layer structure and include a metal or a transparent conductive material. For example, the metal may include molybdenum (Mo), silver (Ag), titanium (Ti), copper (Cu), aluminum (Al), or an alloy thereof. The transparent conductive material may include a transparent conductive oxide such as, for example, indium tin oxide (ITO), indium zinc oxide (IZO), zinc oxide (ZnO), or indium tin zinc oxide (ITZO). Alternatively, the transparent conductive material may include a conductive polymer such as poly(3,4-ethylenedioxythiophene (PEDOT), metal nanowires, or graphene. Further, each of the conductive layers TML1 and TML2 may have a multi-layered structure of metal layers. The multi-layer structure of the metal layers may include, for example, a three-layer structure of titanium/aluminum/titanium (Ti/Al/Ti). Each of the conductive layers TML1 and TML2 having the multi-layer structure may include at least one metal layer and at least one transparent conductive layer.

A portion of the second conductive layer TML2 may be connected to the first conductive layer TML1 via a contact hole defined in the second sensing insulating layer TIL2. The first bridge patterns BP1 as illustrated in FIG. 4 may be included in the first conductive layer TML1, while the first sensing patterns SP1 and the second sensing electrode TE2 may be included in the second conductive layer TML2. The first conductive lines MSL1 and the second conductive lines MLS2 may constitute the first sensing patterns SP1, the second sensing patterns SP2, and the second bridge patterns BP2. Therefore, the conductive lines MSL as illustrated in FIG. 5B may constitute the second conductive layer TML2. In an embodiment of the present disclosure, the conductive lines MSL constituting the second conductive layer TML2 may include a transparent conductive material. By using two layers (e.g., the first conductive layer TML1 and the second conductive layer TML2) of the sensing electrodes such as the first sensing electrodes TE1 and the second sensing electrodes TE2, a resistance of each of the sensing electrodes may be lowered.

As shown in FIG. 7, the line patterns P-H overlapping at least a portion of each of the conductive layers TML1 and TML2 may be defined in the partitioning wall PW. The line patterns P-H according to the present embodiment may be formed so as to extend through the upper layer L2 and the lower layer L1. In this embodiment, the line patterns P-H may expose an upper surface P-U of the pixel defining layer PDL. For example, each of the line patterns P-H may be formed by removing the upper layer L2 and the lower layer L1 to expose an upper surface P-U of the pixel defining layer PDL.

Dummy holes D-H respectively corresponding to the line patterns P-H may be defined in the dummy pattern DMP. The dummy holes D-H may overlap the non-display area NPXA, and each of the dummy holes D-H may overlap a corresponding line pattern P-H. One dummy hole D-H may be defined by a first side surface E-S of the first pattern D-ED, a second side surface C-S of the second pattern D-CE, and a third side surface P-S of the third pattern D-CP aligned with each other along the third direction DR3.

In this embodiment, the first inorganic layer LIL may directly contact a lower side surface L1-S of the lower layer L1 defining the line pattern P-H, an upper side surface L2-S of the upper layer L2 defining the line pattern P-H, the first side surface E-S of the first pattern D-ED, the second side surface C-S of the second pattern D-CE, the third side surface P-S of the third pattern D-CP, and the upper surface P-U of the pixel defining layer PDL exposed through the line pattern P-H in an area overlapping with the line pattern P-H. In an embodiment of the present disclosure, the lower side surface L1-S of the lower layer L1 and the upper side surface L2-S of the upper layer L2 may be aligned with the first side surface E-S of the first pattern D-ED, the second side surface C-S of the second pattern D-CE, and the third side surface P-S of the third pattern D-CP along the third direction DR3.

The organic layer OL may be disposed on the first inorganic layer LIL covering the line patterns P-H in an area overlapping with the line patterns P-H.

As described above, since the line patterns P-H are filled with layers including insulating materials such as the first inorganic layer LIL and the organic layer OL, there is no capacitance formed between the line patterns P-H and the conductive layers TML1 and TML2. According to the present embodiment, as the line patterns P-H of the partitioning wall PW overlap with an area where the conductive layers TML1 and TML2 are disposed, a size of an area in which the partitioning wall PW including the conductive material and the conductive layers TML1 and TML2 overlap each other may be minimized. Accordingly, parasitic capacitance generated between the conductive layers TML1 and TML2 and the partitioning wall PW may be minimized, thus providing the display device DD (see FIG. 1A) with the input sensor INS having enhanced sensing performance.

Figure 8:
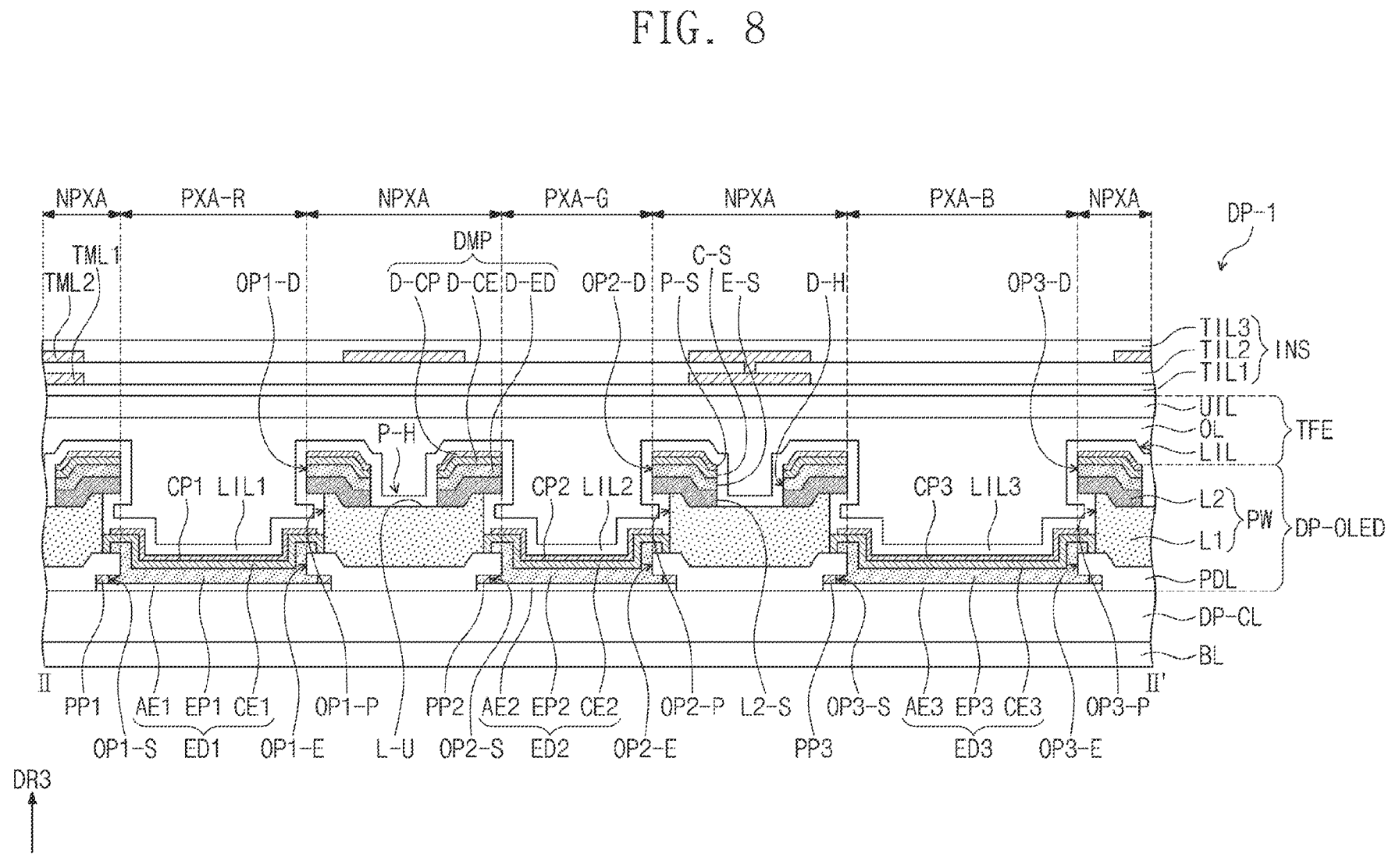
Figure 9:
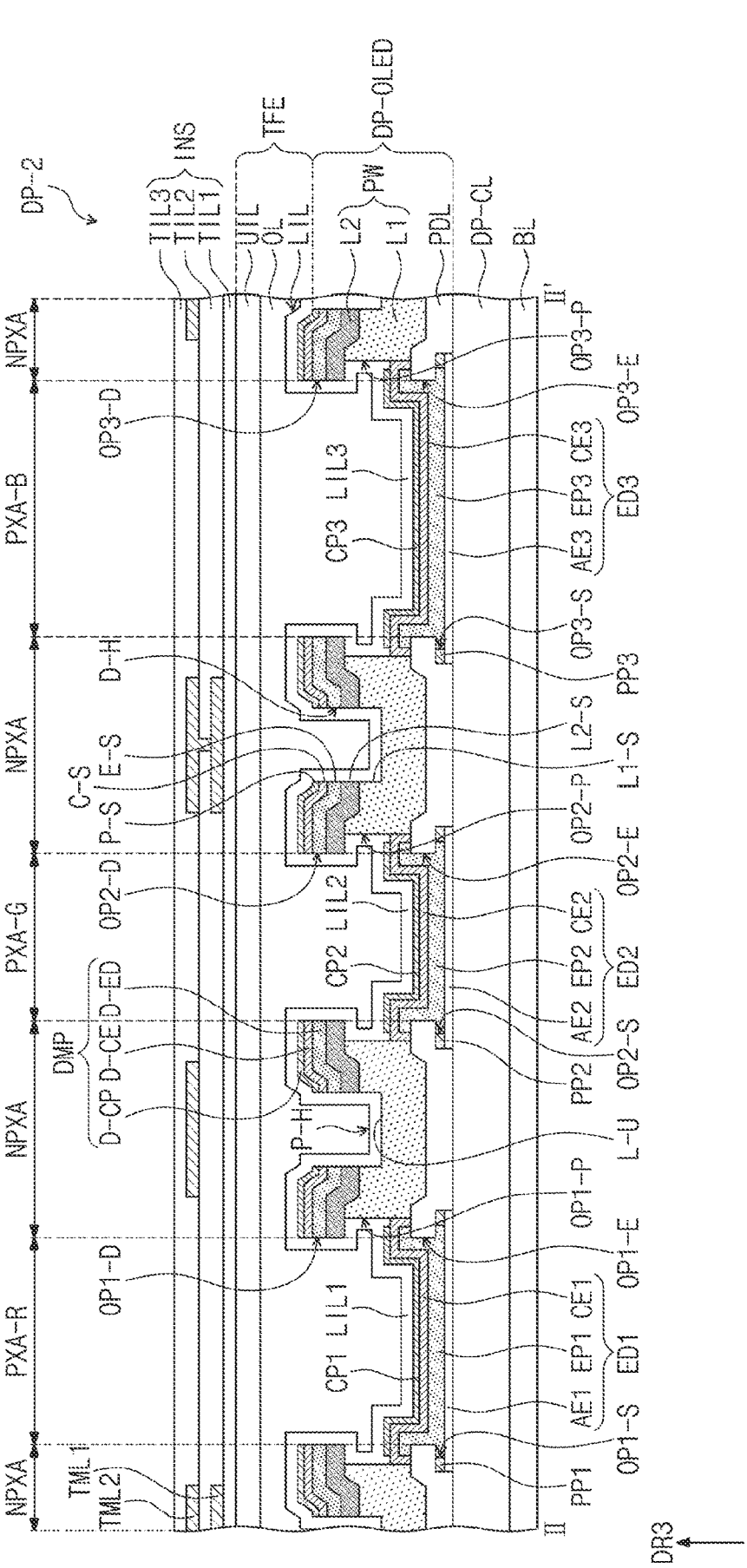
FIG. 9 is a cross-sectional view of a display panel according to an embodiment of the present disclosure.

FIG. 8 is a cross-sectional view of a display panel according to an embodiment of the present disclosure. FIG. 9 is a cross-sectional view of a display panel according to an embodiment of the present disclosure. FIG. 8 and FIG. 9 are cross-sectional views of an area corresponding to FIG. 7. Further, the same/similar reference numerals are used for components identical/similar to those as described above with reference to FIG. 1A to FIG. 7, and redundant descriptions thereof are omitted.

Referring to FIG. 8, a display panel DP-1 according to an embodiment of the present disclosure may include the base layer BL, the circuit element layer DP-CL, the display element layer DP-OLED, and the encapsulation layer TFE. The display element layer DP-OLED may include the light-emitting elements ED1, ED2, and ED3, the first to third sacrificial patterns PP1, PP2, and PP3, the pixel defining layer PDL, the partitioning wall PW, and the dummy patterns DMP. The circuit element layer DP-CL may include at least one transistor connected to each of the light-emitting elements ED1, ED2, and ED3 included in the display element layer DP-OLED. The at least one transistor may drive each of the light-emitting elements ED1, ED2, and ED3. For example, the display panel DP may include at least one transistor disposed on the base layer BL and connected to a corresponding one of the first to third anodes AE1, AE2, and AE3. Descriptions about the base layer BL, the circuit element layer DP-CL, the display element layer DP-OLED, and the encapsulation layer TFE may correspond to the descriptions about the base layer BL, the circuit element layer DP-CL, the display element layer DP-OLED, and the encapsulation layer TFE as set forth above with reference to FIG. 7. Only differences thereof from the display panel DP as described above and illustrated in FIG. 7 will be described.

The display panel DP-1 according to this embodiment may include the partitioning wall PW disposed on the pixel defining layer PDL. The partitioning wall PW may electrically connect the first to third cathodes CE1, CE2, and CE3 of the respective light-emitting elements ED1, ED2, and ED3 to each other. The partitioning wall PW may include the lower layer L1 disposed on the pixel defining layer PDL and the upper layer L2 disposed on the lower layer L1. The lower layer L1 may include a conductive material. The upper layer L2 may be disposed on the lower layer L1. The upper layer L2 may include a metal or a non-metal material.

A thickness of the lower layer L1 may be greater than a thickness of the upper layer L2. Further, in a cross-sectional view, a width of the lower layer L1 may be smaller than a width of the upper layer L2. Accordingly, the upper layer L2 may be stacked on top of the lower layer L1 so as to form an undercut shape in a cross-sectional view. A protruding portion of the upper layer L2 beyond the lower layer L1 may be defined as the tip. For example, the upper layer L2 may have two overhang portions above the lower layer L1.

Each of the first to third anodes AE1, AE2, and AE3 may be disposed in corresponding one of the first to third light-emitting opening OP1-E, OP2-E, and OP3-E. Each of first to third the light-emitting patterns EP1, EP2, and EP3 and the first to third cathodes CE1, CE2 and CE3 may be disposed in corresponding one of the first to third partitioning wall openings OP1-P, OP2-P, and OP3-P. According to the present disclosure, individually patterned first to third cathodes CE1, CE2, and CE3 may directly contact a side surface of the lower layer L1.

The first to third cathodes CE1, CE2, and CE3 may be physically isolated from each other via the upper layer L2 constituting the tip and may be respectively disposed in the first to third light-emitting openings OP1-E, OP2-E, and OP3-E. The first to third cathodes CE1, CE2, and CE3 may contact the lower layer L1 and thus may be electrically connected to each other and thus may receive a common voltage. The lower layer L1 may have a relatively high electrical conductivity and a large thickness compared to those of the upper layer L2, so that contact resistance of the lower layer L1 with the first to third cathodes CE1, CE2, and CE3 may be reduced. Accordingly, a common cathode voltage may be uniformly provided to the light-emitting areas PXA-R, PXA-G, and PXA-B.

The display panel DP-1 according to an embodiment of the present disclosure may further include the dummy pattern DMP. The dummy pattern DMP may include the first pattern D-ED, the second pattern D-CE, and the third pattern D-CP sequentially stacked on the upper layer L2 of the partitioning wall PW. The dummy pattern DMP may be covered with the first inorganic layer LIL.

The first pattern D-ED may include a material the same as that of each of the first to third light-emitting patterns EP1, EP2, and EP3 and may be formed in a process the same as that in which the first to third light-emitting patterns EP1, EP2, and EP3 are formed.

The second pattern D-CE may include a material the same as that of each of the first to third cathodes CE1, CE2, and CE3 and may be formed in a process the same as that in which the first to third cathodes CE1, CE2, and CE3 are formed.

The third pattern D-CP may include a material the same as that of each of the first to third capping patterns CP1, CP2, and CP3 and may be formed in a process the same as that in which the first to third capping patterns CP1, CP2, and CP3 are formed.

The first to third dummy openings OP1-D, OP2-D, and OP3-D corresponding to the first to third light-emitting openings OP1-E, OP2-E, and OP3-E may be defined in the dummy pattern DMP.

The line patterns P-H overlapping at least a portion of each of the conductive layers TML1 and TML2 may be defined in the partitioning wall PW. The line patterns P-H according to the present embodiment may be formed so as to extend through the upper layer L2, but not through the lower layer L1. In this embodiment, the line patterns P-H may expose an upper surface L-U of the lower layer L1. For example, each of the line patterns P-H may be formed by removing the upper layer L2 to expose an upper surface L-U of the lower layer L1.

The dummy holes D-H corresponding to the line patterns P-H may be defined in the dummy pattern DMP. The dummy holes D-H may overlap the non-display area NPXA, and each dummy hole D-H may overlap the corresponding line pattern P-H. One dummy hole D-H may be defined by the first side surface E-S of the first pattern D-ED, the second side surface C-S of the second pattern D-CE, and the third side surface P-S of the third pattern D-CP aligned with each other along the third direction DR3.

In this embodiment, the first inorganic layer LIL may directly contact the upper side surface L2-S of the upper layer L2 defining the line pattern P-H, the first side surface E-S of the first pattern D-ED, the second side surface C-S of the second pattern D-CE, the third side surface P-S of the third pattern D-CP, and the upper surface L-U of the lower layer L1 exposed through the line pattern P-H in an area overlapping with the line pattern P-H. In an embodiment of the present disclosure, the upper side surface L2-S of the upper layer L2 may be aligned with the first side surface E-S of the first pattern D-ED, the second side surface C-S of the second pattern D-CE, and the third side surface P-S of the third pattern D-CP along the third direction DR3

The organic layer OL may be disposed on the first inorganic layer LIL covering the line patterns P-H in an area overlapping with the line patterns P-H.

According to this embodiment, as the line patterns P-H of the partitioning wall PW overlap with an area where the conductive layers TML1 and TML2 are disposed, a size of an area in which the partitioning wall PW including the conductive material and the conductive layers TML1 and TML2 overlap each other may be minimized. Accordingly, parasitic capacitance generated between the conductive layers TML1 and TML2 and the partitioning wall PW may be minimized, thus providing the display device DD (see FIG. 1A) with the input sensor INS having enhanced sensing performance.

Referring to FIG. 9, a display panel DP-2 according to an embodiment of the present disclosure may include the base layer BL, the circuit element layer DP-CL, the display element layer DP-OLED, and the encapsulation layer TFE. The display element layer DP-OLED may include the light-emitting elements ED1, ED2, and ED3, the first to third sacrificial patterns PP1, PP2, and PP3, the pixel defining layer PDL, the partitioning wall PW, and the dummy patterns DMP. The circuit element layer DP-CL may include at least one transistor connected to each of the light-emitting elements ED1, ED2, and ED3 included in the display element layer. The at least one transistor may drive each of the light-emitting elements ED1, ED2, and ED3. Descriptions about the base layer BL, the circuit element layer DP-CL, the display element layer DP-OLED, and the encapsulation layer TFE may correspond to the descriptions about the base layer BL, the circuit element layer DP-CL, the display element layer DP-OLED, and the encapsulation layer TFE as set forth above with reference to FIG. 7. Only differences thereof from the display panel DP as described above and illustrated in FIG. 7 and FIG. 8 will be described.

The display panel DP-2 according to this embodiment may include the partitioning wall PW disposed on the pixel defining layer PDL. The partitioning wall PW may electrically connect the first to third cathodes CE1, CE2, and CE3 of the respective light-emitting elements ED1, ED2, and ED3 to each other. The partitioning wall PW may include the lower layer L1 disposed on the pixel defining layer PDL and the upper layer L2 disposed on the lower layer L1. The lower layer L1 may include a conductive material. The upper layer L2 may be disposed on the lower layer L1. The upper layer L2 may include a metal or a non-metal material.

A thickness of the lower layer L1 may be greater than a thickness of the upper layer L2. Further, in a cross-sectional view, a width of the lower layer L1 may be smaller than a width of the upper layer L2. Accordingly, the upper layer L2 may be stacked on top of the lower layer L1 so as to form an undercut shape in a cross-sectional view. A protruding portion of the upper layer L2 beyond the lower layer L1 may be defined as the tip. For example, the upper layer L2 may have two overhang portions above the lower layer L1.

Each of the first to third anodes AE1, AE2, and AE3 may be disposed in corresponding one of the first to third light-emitting opening OP1-E, OP2-E, and OP3-E. Each of the first to third light-emitting patterns EP1, EP2, and EP3 and the first to third cathodes CE1, CE2 and CE3 may be disposed in corresponding one of the first to third partitioning wall openings OP1-P, OP2-P, and OP3-P. According to the present disclosure, individually patterned first to third cathodes CE1, CE2, and CE3 may directly contact a side surface of the lower layer L1.

The first to third cathodes CE1, CE2, and CE3 may be physically isolated from each other via the upper layer L2 constituting the tip and may be respectively disposed in the first to third light-emitting openings OP1-E, OP2-E, and OP3-E. The first to third cathodes CE1, CE2, and CE3 may contact the lower layer L1 and thus may be electrically connected to each other and thus may receive a common voltage. The lower layer L1 may have a relatively high electrical conductivity and a large thickness compared to those of the upper layer L2, so that contact resistance of the lower layer L1 with the first to third cathodes CE1, CE2, and CE3 may be reduced. Accordingly, a common cathode voltage may be uniformly provided to the light-emitting areas PXA-R, PXA-G, and PXA-B.

The display panel DP-2 according to an embodiment of the present disclosure may further include the dummy pattern DMP. The dummy pattern DMP may include the first pattern D-ED, the second pattern D-CE, and the third pattern D-CP sequentially stacked on the upper layer L2 of the partitioning wall PW. The dummy pattern DMP may be covered with the first inorganic layer LIL.

The first pattern D-ED may include a material the same as that of each of the first to third light-emitting patterns EP1, EP2, and EP3 and may be formed in a process the same as that in which the first to third light-emitting patterns EP1, EP2, and EP3 are formed.

The second pattern D-CE may include a material the same as that of each of the first to third cathodes CE1, CE2, and CE3 and may be formed in a process the same as that in which the first to third cathodes CE1, CE2, and CE3 are formed.

The third pattern D-CP may include a material the same as that of each of the first to third capping patterns CP1, CP2, and CP3 and may be formed in a process the same as that in which the first to third capping patterns CP1, CP2, and CP3 are formed.

The first to third dummy openings OP1-D, OP2-D, and OP3-D corresponding to the first to third light-emitting openings OP1-E, OP2-E, and OP3-E may be defined in the dummy pattern DMP.

The line patterns P-H overlapping at least a portion of each of the conductive layers TML1 and TML2 may be defined in the partitioning wall PW. The line patterns P-H according to the present embodiment may be formed so as to extend through the upper layer L2 and a portion of the lower layer L1. In this case, each of the line patterns P-H may be formed by removing the upper layer L2 and a portion of the lower layer L1. For example, the line patterns P-H may extend to penetrate through an upper portion of the lower layer. In this embodiment, the line patterns P-H may expose an inner surface of the lower layer L1. For example, the line patterns P-H may expose an inner side surface and an inner bottom surface of the lower layer L1.

The dummy holes D-H corresponding to the line patterns P-H may be defined in the dummy pattern DMP. The dummy holes D-H may overlap the non-display area NPXA, and each dummy hole D-H may overlap the corresponding line pattern P-H. One dummy hole D-H may be defined by the first side surface E-S of the first pattern D-ED, the second side surface C-S of the second pattern D-CE, and the third side surface P-S of the third pattern D-CP aligned with each other along the third direction DR3.

In this embodiment, the first inorganic layer LIL may directly contact the upper side surface L2-S of the upper layer L2 defining the line pattern P-H, the first side surface E-S of the first pattern D-ED, the second side surface C-S of the second pattern D-CE, the third side surface P-S of the third pattern D-CP, and the inner surface of the lower layer L1 exposed through the line pattern P-H in an area overlapping with the line pattern P-H. In an embodiment of the present disclosure, the inner side surface of the lower layer L1 exposed through the line pattern P-H and the upper side

...

surface L2-S of the upper layer L2 may be aligned with the first side surface E-S of the first pattern D-ED, the second side surface C-S of the second pattern D-CE, and the third side surface P-S of the third pattern D-CP along the third direction DR3.

According to this embodiment, as the line patterns P-H of the partitioning wall PW overlap with an area where the conductive layers TML1 and TML2 are disposed, a size of an area in which the partitioning wall PW including the conductive material and the conductive layers TML1 and TML2 overlap each other may be minimized. Accordingly, parasitic capacitance generated between the conductive layers TML1 and TML2 and the partitioning wall PW may be minimized, thus providing the display device DD (see FIG. 1A) with the input sensor INS having enhanced sensing performance.

Figure 10:
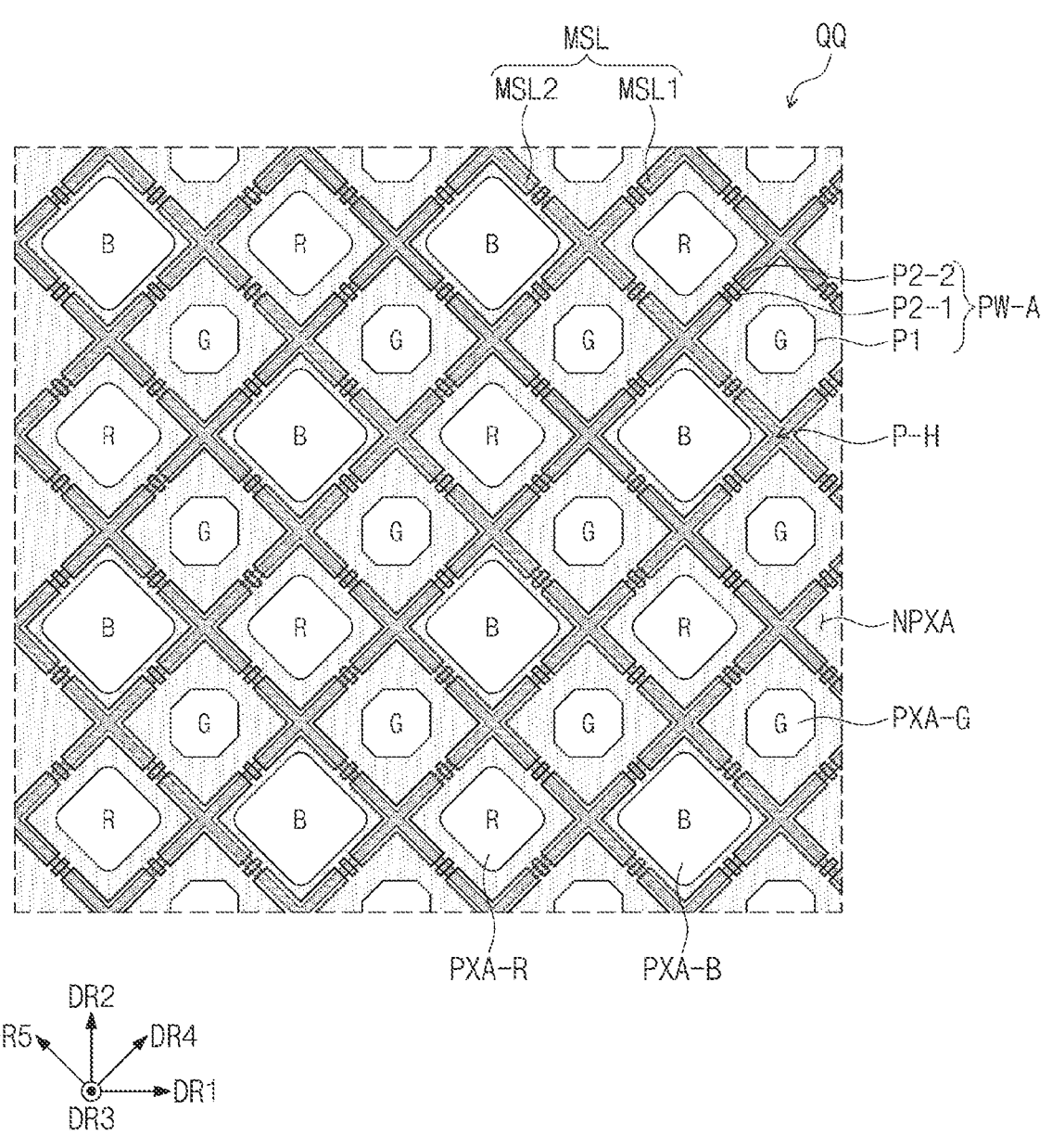
FIG. 10 is a plan view of a display panel according to an embodiment of the present disclosure.

FIG. 10 is a plan view of a display panel according to an embodiment of the present disclosure. FIG. 10 shows an area corresponding to FIG. 5B. The same/similar reference numerals are used for components identical/similar to those as described above and illustrated in FIG. 1A to FIG. 7, and redundant descriptions thereof are omitted.

Referring to FIG. 10, the display panel DP (see FIG. 3) according to an embodiment of the present disclosure may include the light-emitting areas PXA-R, PXA-G, and PXA-B providing light of different colors, and the non-light-emitting area NPXA adjacent to the light-emitting areas PXA-R, PXA-G, and PXA-B. The light-emitting areas PXA-R, PXA-G, and PXA-B may have different areas based on colors of light emitted therefrom. For example, the pixel PX of the light-emitting area PXA-R may generate the red light, the pixel PX of the light-emitting area PXA-G may generate the green light, and the pixel PX of the light-emitting area PXA-B may generate the blue light. The non-light-emitting area NPXA may be defined as an area between the light-emitting areas PXA-R, PXA-G, and PXA-B and may overlap with the pixel defining layer PDL (see FIG. 6). The shape of the light-emitting areas PXA-R, PXA-G, and PXA-B may be generally, for example, an octagon, a square or a diamond with or without rounded corners. It is, however, to be understood that the present disclosure is not limited thereto. For example, the shape of the light-emitting areas PXA-R. PXA-G, and PXA-B may be a circle, or other polygons with or without rounded corners. The light-emitting areas PXA-R, PXA-G, and PXA-B may have different shapes and/or sizes from each other.

The partitioning wall PW may be disposed on the pixel defining layer PDL (see FIG. 6). According to the present embodiment, the partitioning wall PW may be a structure for electrically connecting the first to third cathodes CE1, CE2, and CE3 respectively patterned in the light-emitting elements ED1, ED2, and ED3 to each other. Accordingly, the partitioning wall PW may include a conductive material.

The partitioning wall PW may non-overlap with the light-emitting areas PXA-R, PXA-G, and PXA-B and may overlap with the non-light-emitting area NPXA in a plan view. The partitioning wall PW may include the first patterns P1 and second patterns P2-1 and P2-2 in a plan view. Each of the first patterns P1 may surround corresponding one of the light-emitting areas PXA-R, PXA-G, and PXA-B. Each of the second patterns P2-1 and P2-2 may be disposed between adjacent ones of the light-emitting areas PXA-R, PXA-G, and PXA-B. The second patterns P2-1 and P2-2 may include the second-first pattern P2-1 and the second-second pattern P2-2. A portion of the partitioning wall PW may be disposed between the second-first pattern P2-1 and the second-second pattern P2-2 adjacent to each other. In this embodiment, two second patterns P2-1 and P2-2 may be disposed between adjacent ones of the light-emitting areas PXA-R, PXA-G, and PXA-B. In this embodiment, the two second patterns P2-1 and P2-2 disposed between adjacent ones of the first patterns P1 may be spaced apart from each other. For example, the second-first pattern P2-1 and the second-second pattern P2-2 adjacent to each other may be spaced apart from each other.

For example, around one first light-emitting area PXA-R, the second-first pattern P2-1 and the second-second pattern P2-2 may be disposed between the second light-emitting area PXA-G and the first light-emitting area PXA-R spaced apart from each other in a fifth direction DR5. Further, the second-first pattern P2-1 and the second-second pattern P2-2 may be disposed between the first light-emitting area PXA-R and the second light-emitting area PXA-G spaced apart from each other in a fourth direction DR4. Therefore, around one first light-emitting area PXA-R, one first pattern P1 surrounding the first light-emitting area PXA-R, and eight second patterns P2-1 and P2-2 extending from the first pattern P1 in the fourth direction DR4 and the fifth direction DR5 may be disposed. For example, four second patterns P2-1 and P2-2 may be disposed at two opposite sides (i.e., two second patterns P2-1 and P2-2 on each side) of the first light-emitting area PXA-R in the fourth direction DR4, and four second patterns P2-1 and P2-2 may be disposed at two opposite sides (i.e., two second patterns P2-1 and P2-2 on each side) of the first light-emitting area PXA-R in the fifth direction DR5.

According to this embodiment, even though one of the second patterns P2-1 and P2-2 is broken due to a crack or the like, the other of the second patterns may be connected to the light-emitting areas PXA-R, PXA-G, and PXA-B. Thus, the common cathode voltage may be provided thereto in a stable manner.

The partitioning wall PW may include the line patterns P-H extending through at least a portion of the partitioning wall PW. In this embodiment, each of the line patterns P-H may have an 'X' shape in a plan view.

According to an embodiment of the present disclosure, the parasitic capacitance generated between the conductive lines included in the input sensor and the partitioning wall including the conductive material may be minimized, thus providing the display device including the input sensor having enhanced sensing performance.

While the present disclosure has been described with reference to embodiments thereof, it will be apparent to those of ordinary skill in the art that various changes and modifications may be made thereto without departing from the spirit and scope of the present disclosure as defined by the appended claims.

What is claimed is:
1. A display device comprising:
a display panel including:
   a base layer including light-emitting areas and a non-light-emitting area adjacent to the light-emitting areas;
   a pixel defining layer disposed on the base layer and having openings defined therein corresponding to the light-emitting areas;
   a partitioning wall disposed on the pixel defining layer;
   light-emitting elements, each including an anode disposed in a corresponding one of the openings defined in the pixel defining layer, a cathode disposed on the anode and contacting the partitioning wall, and a light-emitting pattern disposed between the anode and the cathode; and an encapsulation layer covering the light-emitting elements; and an input sensor disposed on the display panel, the input sensor including conductive lines, with the conductive lines overlapping the partitioning wall, wherein the partitioning wall has line patterns defined therein by removing at least a portion of the partitioning wall, with the line patterns overlapping the non-light-emitting area, and wherein at least some of the conductive lines overlap the line patterns.

2. The display device of claim 1, wherein the partitioning wall includes:

a lower layer including a conductive material and disposed on the pixel defining layer; and an upper layer disposed on the lower layer and including a conductive material.

3. The display device of claim 2, wherein the encapsulation layer includes a first inorganic layer, an organic layer, and a second inorganic layer sequentially stacked, and wherein the first inorganic layer covers the line patterns.

4. The display device of claim 3, further comprising capping patterns respectively disposed on the cathodes corresponding thereto, the capping patterns being covered with the first inorganic layer.

5. The display device of claim 4, further comprising a dummy pattern disposed on the partitioning wall, wherein the dummy pattern has dummy holes defined therein, with the dummy holes respectively overlapping the line patterns, and wherein the dummy pattern includes:

a first pattern disposed on the upper layer and including a material the same as a material of the light-emitting patterns;

a second pattern disposed on the first pattern and including a material the same as a material of the cathodes; and a third pattern disposed on the second pattern, and covered with the first inorganic layer, wherein the third pattern includes a material the same as a material of the capping patterns.

6. The display device of claim 5, wherein each of the lower layer, the upper layer, the first pattern, the second pattern, and the third pattern includes an opening defined therein overlapping corresponding one of the light-emitting areas, and wherein a width of the opening defined in the lower layer is greater than each of a width of the opening defined in the upper layer, a width of the opening defined in the first pattern, a width of the opening defined in the second pattern, and a width of the opening defined in the third pattern.

7. The display device of claim 3, wherein the organic layer is disposed on the first inorganic layer covering the line patterns.

8. The display device of claim 2, wherein the lower layer includes aluminum, and the upper layer includes titanium.

9. The display device of claim 2, wherein each of the line patterns is formed by removing the upper layer and the lower layer to expose an upper surface of the pixel defining layer.

10. The display device of claim 2, wherein each of the line patterns is formed by removing the upper layer to expose an upper surface of the lower layer.

11. The display device of claim 2, wherein each of the line patterns is formed by removing the upper layer and a portion of the lower layer.

12. The display device of claim 1, wherein the partitioning wall includes:

first patterns, each surrounding each of the light-emitting elements corresponding thereto in a plan view of the display device; and second patterns, at least one of the second patterns being disposed between adjacent ones of the first patterns, wherein the line patterns non-overlap with the second patterns.

13. The display device of claim 12, wherein some of the conductive lines overlap the second patterns.

14. The display device of claim 12, wherein two of the second patterns adjacent to each other and spaced apart from each other are disposed between the adjacent ones of the first patterns.

15. The display device of claim 1, wherein the input sensor includes:

a first sensing insulating layer directly disposed on the encapsulation layer;

a first conductive layer disposed on the first sensing insulating layer;

a second sensing insulating layer covering the first conductive layer and disposed on the first sensing insulating layer;

a second conductive layer disposed on the second sensing insulating layer; and a third sensing insulating layer covering the second conductive layer and disposed on the second sensing insulating layer, wherein the conductive lines are included in the second conductive layer.

16. The display device of claim 1, further comprising sacrificial patterns, wherein each of the sacrificial patterns is disposed on an edge of a corresponding one of the anodes, and is covered with a corresponding one of the light-emitting patterns and the pixel defining layer.

17. The display device of claim 1, wherein each of the line patterns is disposed between four of the cathodes and has an 'X' shape in a plan view of the display device.

18. The display device of claim 1, wherein the cathodes are electrically connected to each other via the partitioning wall.

19. The display device of claim 1, wherein each of the conductive lines includes a transparent conductive material.

20. The display device of claim 1, wherein the display panel includes at least one transistor disposed on the base layer and connected to a corresponding one of the anodes.

* * * * *